(12) United States Patent
Yoshida et al.

(10) Patent No.: US 10,584,031 B2
(45) Date of Patent: Mar. 10, 2020

(54) NITRIDE CRYSTAL SUBSTRATE

(71) Applicants: SCIOCS COMPANY LIMITED, Ibaraki (JP); SUMITOMO CHEMICAL COMPANY, LIMITED, Tokyo (JP)

(72) Inventors: Takehiro Yoshida, Ibaraki (JP); Masatomo Shibata, Ibaraki (JP)

(73) Assignees: SCIOCS COMPANY LIMITED, Ibaraki (JP); SUMITOMO CHEMICAL COMPANY, LIMITED, Tokyo (JP)

( * ) Notice: Subject to any disclaimer, the term of this patent is extended or adjusted under 35 U.S.C. 154(b) by 0 days.

(21) Appl. No.: 16/082,598

(22) PCT Filed: Mar. 1, 2017

(86) PCT No.: PCT/JP2017/008140
§ 371 (c)(1),
(2) Date: Sep. 6, 2018

(87) PCT Pub. No.: WO2017/154701
PCT Pub. Date: Sep. 14, 2017

(65) Prior Publication Data
US 2019/0119112 A1    Apr. 25, 2019

(30) Foreign Application Priority Data
Mar. 8, 2016 (JP) ................. 2016-044829

(51) Int. Cl.
*B32B 9/00* (2006.01)
*C01B 21/06* (2006.01)
(Continued)

(52) U.S. Cl.
CPC .......... *C01B 21/0632* (2013.01); *C23C 16/34* (2013.01); *C30B 25/20* (2013.01);
(Continued)

(58) Field of Classification Search
None
See application file for complete search history.

(56) References Cited

U.S. PATENT DOCUMENTS 8,501,592 B2 * 8/2013 Fujiwara .................. C30B 9/12
117/63
9,518,340 B2 * 12/2016 Hashimoto ........... C30B 29/406
(Continued)

FOREIGN PATENT DOCUMENTS

JP    11-268989 A    10/1999
JP    2006-290676 A    10/2006
(Continued)

OTHER PUBLICATIONS

Bertram et al., "Strain Relaxation and Strong Impurity Incorporation in Epitaxial Leterally Overgrown GaN", Jan. 18, 1999, Applied Physics Letters, V. 74, No. 3, p. 359-361. (Year: 1999).*
(Continued)

*Primary Examiner* — Seth Dumbris
*Assistant Examiner* — Kim S. Horger
(74) *Attorney, Agent, or Firm* — Pearne & Gordon LLP

(57) ABSTRACT

There is provided a nitride crystal substrate made of a nitride crystal with a diameter of 100 mm or more, having on its main surface: a continuous high dislocation density region and a plurality of low dislocation density regions divided by the high dislocation density region, with the main surface not including a polarity inversion domain.

8 Claims, 15 Drawing Sheets

(51) Int. Cl.
    *C30B 29/40*     (2006.01)
    *C30B 25/20*     (2006.01)
    *C23C 16/34*     (2006.01)
    *H01L 29/20*     (2006.01)
    *H01L 21/02*     (2006.01)

(52) U.S. Cl.
    CPC ........ *C30B 29/406* (2013.01); *H01L 29/2003* (2013.01); *C01P 2002/82* (2013.01); *C01P 2004/02* (2013.01); *H01L 21/0254* (2013.01); *H01L 21/0262* (2013.01); *H01L 21/02389* (2013.01); *H01L 21/02428* (2013.01)

(56) References Cited

U.S. PATENT DOCUMENTS

| | | |
|---|---|---|
| 2006/0226414 A1 | 10/2006 | Oshima |
| 2008/0156254 A1* | 7/2008 | Dwilinski ............... B82Y 20/00 117/1 |
| 2009/0236694 A1 | 9/2009 | Mizuhara et al. |
| 2010/0200955 A1* | 8/2010 | Oshima ................... C30B 25/02 257/615 |
| 2012/0000415 A1* | 1/2012 | D'Evelyn ............... C30B 25/02 117/94 |
| 2012/0112320 A1 | 5/2012 | Kubo et al. |
| 2012/0315445 A1 | 12/2012 | Mizuhara et al. |
| 2013/0160699 A1 | 6/2013 | Mizuhara et al. |
| 2014/0175616 A1 | 6/2014 | Mizuhara et al. |
| 2015/0008563 A1 | 1/2015 | Mizuhara et al. |
| 2017/0073839 A1 | 3/2017 | Mori et al. |
| 2017/0145591 A1 | 5/2017 | Yoshida |
| 2017/0191186 A1 | 7/2017 | Mori et al. |
| 2017/0247813 A1 | 8/2017 | Yoshida |
| 2017/0314157 A1 | 11/2017 | Mori et al. |
| 2018/0087185 A1 | 3/2018 | Yoshida |

FOREIGN PATENT DOCUMENTS

| | | |
|---|---|---|
| JP | 2008-143772 A | 6/2008 |
| JP | 2009-282224 A | 12/2009 |
| JP | 4915128 B2 | 4/2012 |
| JP | 2013-143186 A | 7/2013 |
| JP | 5620762 B2 | 11/2014 |
| JP | 5757068 B2 | 7/2015 |
| JP | 2015-157760 A | 9/2015 |
| JP | 2015-166293 A | 9/2015 |
| JP | 2015-224143 A | 12/2015 |
| JP | 2017-008187 A | 1/2017 |
| JP | 2017-014106 A | 1/2017 |
| JP | 2017-024984 A | 2/2017 |
| JP | 2018-039693 A | 3/2018 |
| JP | 2018-090444 A | 6/2018 |

OTHER PUBLICATIONS

Translation of the International Preliminary Report on Patentability and Written Opinion for PCT/JP2017/008140 (dated Sep. 20, 2018).
International Search Report and Written Opinion for PCT/JP2017/008140 (dated May 16, 2017).

* cited by examiner

CRYSTAL GROWTH SURFACE
(c-PLANE)

CRYSTAL GROWTH SURFACE
(c-PLANE)

FIG. 4A
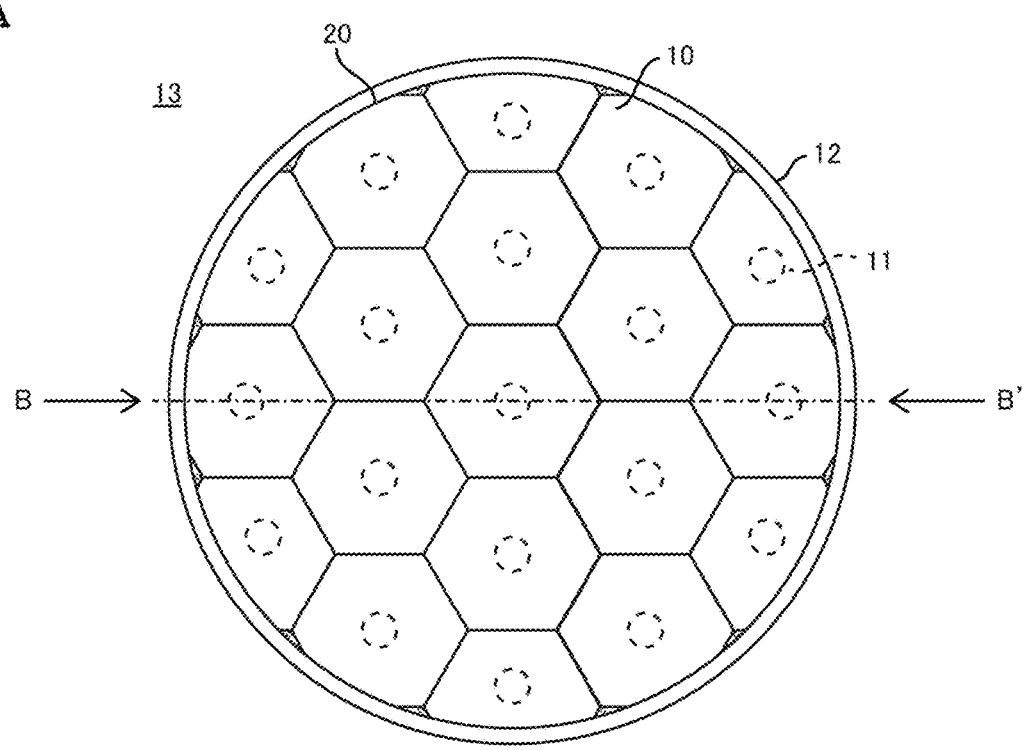
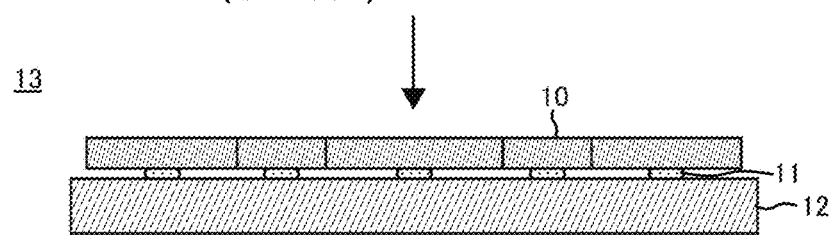
FIG. 4B

FIG. 5
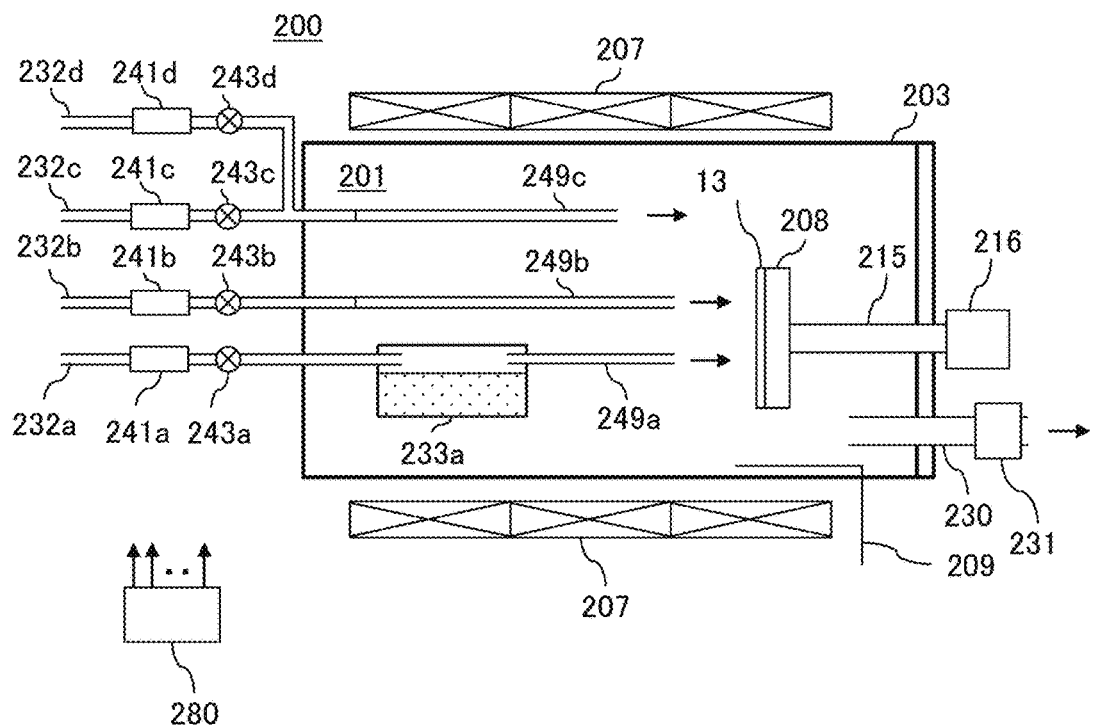
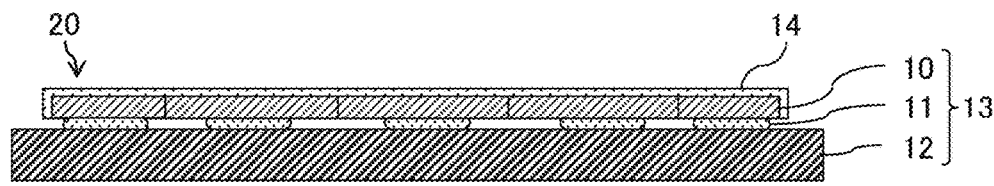
FIG. 6A
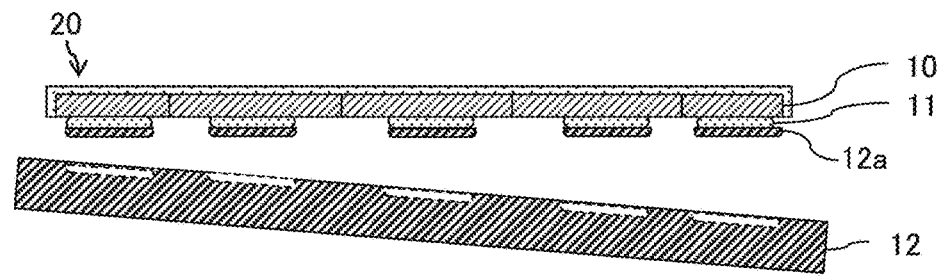
FIG. 6B
FIG. 6C

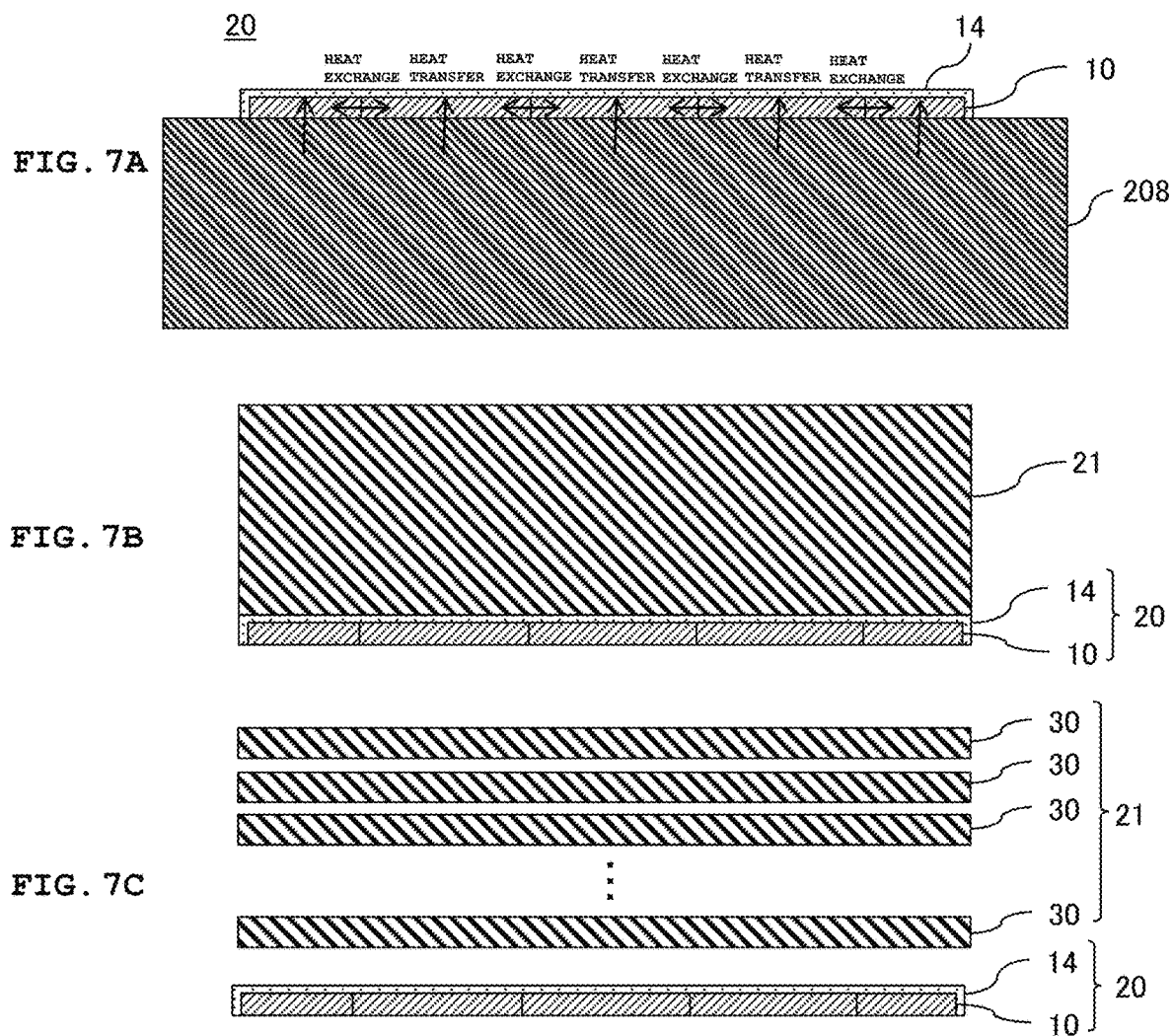

32    31    32
  33

33

σ = 0.13Δv GPa

NITRIDE CRYSTAL SUBSTRATE

TECHNICAL FIELD

The present invention relates to a nitride crystal substrate.

DESCRIPTION OF RELATED ART

A substrate made of a nitride crystal such as gallium nitride for example (referred to as a nitride crystal substrate hereafter), is used when manufacturing a semiconductor device such as a light-emitting element and a high-speed transistor. The nitride crystal substrate can be manufactured through the step of growing nitride crystals on a sapphire substrate or a substrate for crystal growth which is prepared using the sapphire substrate. In recent years, in order to obtain a nitride crystal substrate with a large diameter exceeding, for example, 2 inches, there is an increasing need for obtaining a substrate for crystal growth with a larger diameter (for example, see patent document 1).

PRIOR ART DOCUMENT

Patent Document

Patent document 1: Japanese Patent Laid Open Publication No. 2006-290676

SUMMARY

Problem to be Solved by Disclosure

An object of the present disclosure is to provide a technique of increasing a diameter of a substrate for crystal growth, and a technique relating to a high-quality nitride crystal substrate manufactured using this substrate.

Means for Solving the Problem

According to an aspect of the present disclosure, there is provided a nitride crystal substrate made of a nitride crystal with a diameter of 100 mm or more, having on its main surface:
a continuous high dislocation density region and a plurality of low dislocation density regions divided by the high dislocation density region, with the main surface not including a polarity inversion domain.

Advantage of the Disclosure

According to the present disclosure, it is possible to obtain the high-quality nitride crystal substrate while responding to the need for the large diameter.

BRIEF DESCRIPTION OF THE DRAWINGS

FIG. 4A is a planar view showing a modified example of the assembled substrate 13 formed by adhering the plurality of seed crystal substrates 10 onto the holding plate 12, and FIG. 4B is a cross-sectional view taken along a line B-B' of the assembled substrate 13 shown in FIG. 4A.

FIG. 5 is a schematic view of a vapor phase growth apparatus 200 used when growing crystal films 14 and 21.

FIG. 6A is a pattern diagram showing a state in which the crystal film 14 is grown on the seed crystal substrates 10, FIG. 6B is a pattern diagram showing a state of making a freestanding state of a substrate 20 for crystal growth formed by combining the seed crystal substrates 10, and FIG. 6C is a pattern diagram of the substrate 20 for crystal growth after cleaning a back surface thereof.

FIG. 7A is a pattern diagram showing a state that the substrate 20 for crystal growth configured to be freestandable is placed directly on the suspector 208, FIG. 7B is a pattern diagram showing a state of making the crystal film 21 grow thick on the substrate 20 for crystal growth, and FIG. 7C is a pattern diagram showing a state of obtaining a plurality of nitride crystal substrates 30 by slicing the thickly grown crystal film 21.

DETAILED DESCRIPTION OF THE DISCLOSURE

An Embodiment of the Present Disclosure

An embodiment of the present disclosure will be described hereafter, with reference to the drawings.

(1) Method for Manufacturing a Nitride Crystal Substrate

In this embodiment, explanation is given for an example of manufacturing a crystal substrate made of gallium nitride (GaN) crystals (referred to as a GaN substrate hereafter), as a nitride crystal substrate, by performing steps 1 to 5 shown as follows.

(Step 1: Preparation of Seed Crystal Substrates)

Figure 1A:
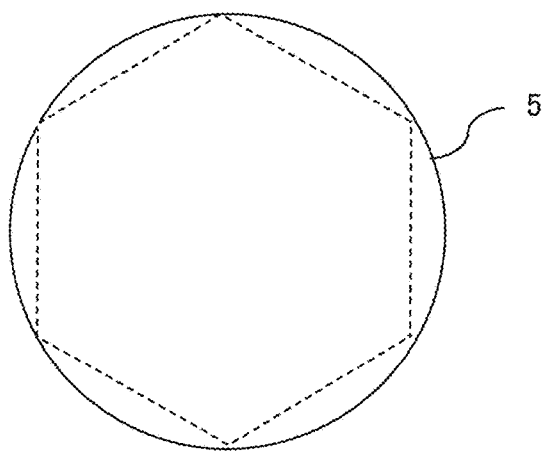
FIG. 1A is a planar view of a small diameter seed substrate 5 used when manufacturing a seed crystal substrate 10.
Figure 2A:
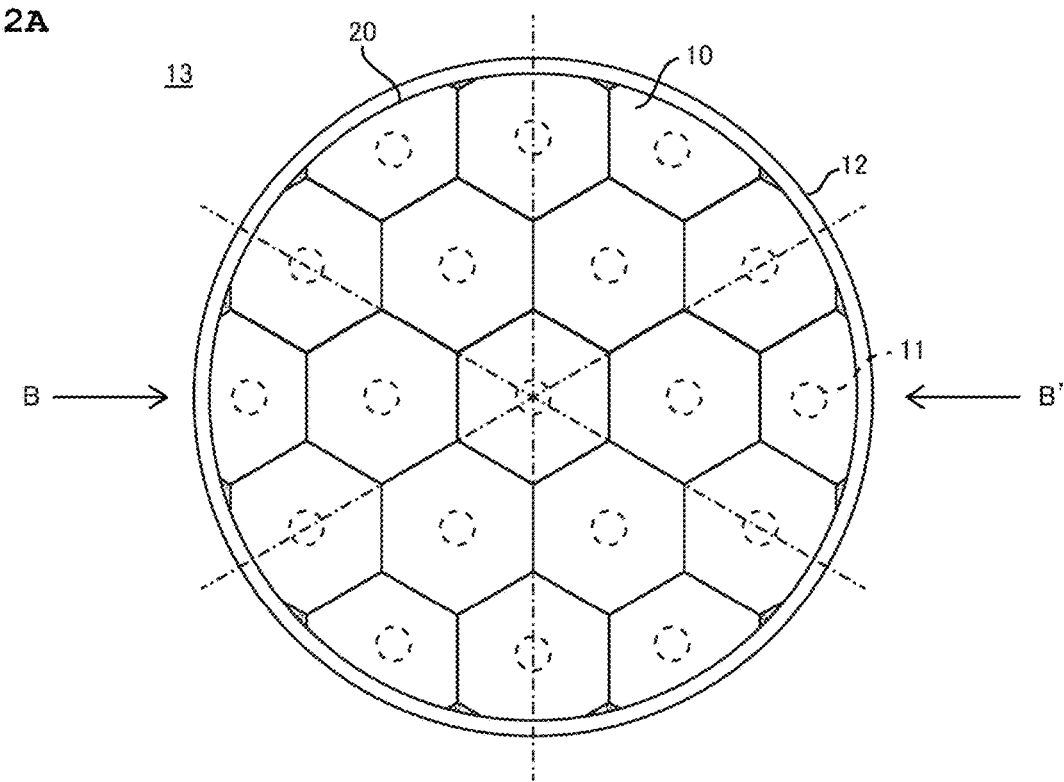
FIG. 2A is a planar view showing an example of an assembled substrate 13 formed by adhering a plurality of seed crystal substrates 10 onto a holding plate 12.

In this embodiment, when the GaN substrate is manufactured, a substrate 20 for crystal growth (also referred to as substrate 20 hereafter) having a disc-like outer shape as exemplified in planar view in FIG. 2A is used. In this step, first, a plurality of small diameter seed substrates (crystal substrates, material substrates) 5 (also referred to as substrate 5 hereafter) made of GaN crystals and whose outer shape is shown by a solid line in FIG. 1A, are prepared as a base material used when preparing seed crystal substrates 10 (also referred to as a substrate 10 hereafter) constituting the substrate 20. Each substrate 5 is a circular substrate having an outer diameter larger than each outer diameter of the substrates 10 to be prepared, and for example, can be prepared by epitaxially growing the GaN crystals on a base substrate such as a sapphire substrate, cutting out grown crystals from the base substrate, and polishing a surface of the crystals. The GaN crystals can be grown using a publicly-known technique, irrespective of a vapor phase growth method or a liquid phase growth method. According to a current state of the art, in a case that a diameter of the substrate is about 2 inches, a high-quality substrate can be obtained at a relatively low cost, with a low defect density and a low impurity concentration, in which a variation of off-angles, namely, a difference between a maximum value and a minimum value of the off-angle in its main surface (base surface for crystal growth), is for example 0.3° or less and relatively small. Here, the off-angle is defined as the angle formed by a normal line direction of a main surface of the substrate 5 and a main axis direction (a normal line direction of a low index plane closest to a main surface) of the GaN crystals constituting the substrate 5.

In this embodiment, as an example, explanation is given for a case of using a substrate with a diameter of about 2 inches and a thickness of 0.2 to 1.0 mm as the substrate 5. Further, explanation is given for the following case in this embodiment: a substrate in which the main surface, namely, a crystal growth surface of the substrate 5 parallel to c-plane of the GaN crystal or having an inclination within ±5°, preferably within ±10 with respect to c-plane, is used as the substrate 5. Further, explanation is given for the following example in this embodiment: when a plurality of substrates 5 are prepared, a substrate group in which the variation of the off-angles (difference between the maximum value and the minimum value of the off-angle) in the main surface of each substrate 5 is 0.3° or less and preferably 0.15° or less, and the variation of the off-angles (difference between the maximum value and the minimum value of the off-angle) among the substrates 5 is 0.3° or less and preferably 0.15° or less, is used as the plurality of substrates 5.

The term of "c-plane" used in this specification can include not only +c plane of the GaN crystal, namely, a plane completely parallel to (0001) plane, but also a plane having a certain degree of inclination (vicinal) with respect to (0001) plane as described above. This point is also applied to a case of using the term of "a-plane" and "M-plane" in this specification. Namely, the term of "a-plane" used in this specification can include not only a-plane of the GaN crystal, namely, a plane completely parallel to (11-20) plane, but also a plane having the similar inclination as the above inclination to this plane. Also, the term of "M-plane" used in this specification can include not only M-plane of the GaN crystal, namely, a plane completely parallel to (10-10) plane, but also a plane having the similar inclination as the above inclination to this plane.

Figure 1B:
FIG. 1B is a cross-sectional view showing a state in which a recessed groove is formed on a back surface of the small diameter seed substrate 5.
Figure 1C:
FIG. 1C is a pattern diagram showing a state of cleaving the small diameter seed substrate 5 along the recessed groove and removing a peripheral portion thereof.
Figure 1D:
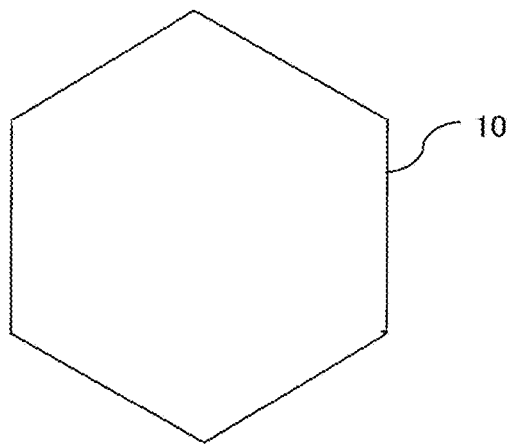
FIG. 1D is a planar view of the seed crystal substrate 10 obtained by removing the peripheral portion of the small diameter seed substrate 5.

After the substrate 5 is prepared, as shown in FIG. 1B, recessed grooves, namely, scribe groves are formed on a back surface (–c plane) which is an opposite side surface of the crystal growth surface (+c plane). The recessed grooves can be formed using a publicly-known technique, for example such as a laser machining and mechanical machining. After the recessed grooves are formed, as shown in FIG. 1C, the substrate 5 is cleaved along the recessed groove and its peripheral portion is removed, whereby the substrate 10 is obtained. FIG. 1D shows a planar configuration of the substrate 10.

When a plurality of substrates 10 are arranged on the same surface, a planar shape of the substrates 10 is preferably a shape capable of forming a tessellation, namely, capable of being laid them over the entire in-plane area without gaps. Further, when main surfaces (crystal growth surfaces) of the substrates 10 are +c planes like this embodiment, for the reason described later, it is preferable that all lateral surfaces of the substrates 10 in contact with lateral surfaces of other substrates 10, namely, all surfaces opposed to (facing) the lateral surfaces of other substrates 10 are M-planes or a-planes, and are planes in the same orientation (equivalent planes) with each other. For example, when the main surfaces (crystal growth surfaces) of the substrates 10 are c-plane like this embodiment, it is conceivable that all lateral surfaces of the substrates 10 opposed to the lateral surfaces of other substrates 10, are a-planes.

Since the GaN crystal has a hexagonal crystal structure, in order to satisfy the above requirement, a planar shape of at least one of the plurality of substrates 10 constituting a portion excluding a peripheral portion (arc portion) of the substrate 20, is preferably an equilateral triangle, a parallelogram (internal angles 60° and 120°), a trapezoid (internal angles 60° and 120°), a regular hexagon, or a parallel hexagon. When the planar shape of the substrate 10 is a square or a rectangle, the following case occurs: when any one of the lateral surfaces of the substrates 10 is a-plane, the lateral surface orthogonal to this plane inevitably becomes M-plane, and not all lateral surfaces of the substrate 10 become the planes in the same orientation. When the planar shape of the substrate 10 is circular or elliptical, the tessellation is impossible, and the lateral surfaces of the substrates 10 cannot be M-planes or a-planes, and cannot be the planes in the same orientation excluding M-plane.

Of the several types of shapes described above, it is particularly preferable that the planar shape of at least one of the plurality of substrates 10 constituting the portion excluding the peripheral portion of the substrate 20 is a regular hexagon as shown in FIG. 1D. In this case, it is possible to efficiently obtain, namely, perform material cutting of the substrate 10 with a maximum size, from the substrate 5 having a circular planar shape. Further, when the tessellation of the substrates 10 is made on the same surface in step 2 described later, a honeycomb pattern is constituted by an arrangement of the plurality of substrates 10, and the plurality of substrates 10 are arranged so as to engage with each other in planar view. As a result, when an external force is applied to the plurality of arranged substrates 10 along an in-plane direction, it is possible to suppress a misalignment of the substrates 10 regardless of the direction. In contrast, when the planar shape of each substrate 10 is an equilateral triangle, a parallelogram, a trapezoid, a square, a rectangle, or the like, the substrates 10 are likely to be affected by an external force from a specific direction, as compared with a case in which the substrate 10 has a regular hexagonal planar shape, thus easily allowing the misalignment of the substrates 10 to occur. In this embodiment, explanation is given for a case in which the substrate 10 has the regular hexagonal planar shape. As shown in FIG. 2A, the substrate 10 constituting the peripheral portion of the substrate 20 has a planar shape such that a part of the regular hexagon is cut out in an arc shape along an outer periphery of the disc shaped substrate 20. For the substrate 10 constituting the peripheral portion of the substrate 20, namely, for the substrate 10 having a small area, one or more, preferably two or more together are preferably obtained from one substrate 5. When the plurality of substrates 10 are obtained from one substrate 5, this is preferable in a point that waste of the substrate 5 can be reduced, and qualities of the substrates 10 can be easily uniform.

Figure 1E:
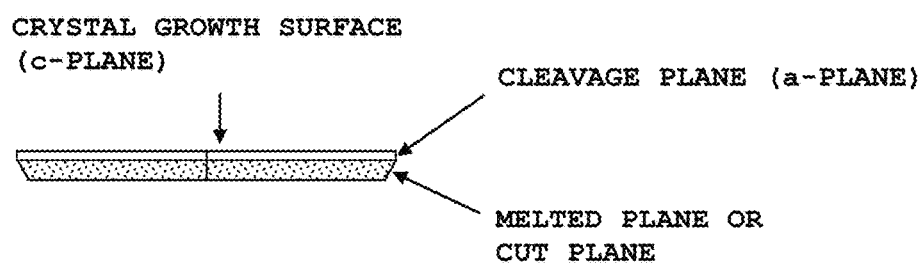
FIG. 1E is a lateral view of the seed crystal substrate 10.

When all lateral surfaces of the substrates 10 opposed to the lateral surfaces of other substrates 10 are M-planes or a-planes, this is preferable in the point described later, as compared with a case in which all lateral surfaces of the substrates 10 opposed to the lateral surfaces of other substrates 10 are the planes excluding "M-plane or a-plane". For example, when all lateral surfaces of the substrates 10 are M-planes, it is possible to enhance a processing accuracy of the substrate 10. This is because regarding M-plane which is one of plane-orientations of the GaN crystal that can be taken, it can be easily cleaved for the reason that an atomic bonding density per unit area is small (bond between atoms is weak), or the like. Further, for example, when all lateral surfaces of the substrates 10 are a-planes, re-breaking hardly occurs at a combined portion opposed to other lateral surface, thereby the accuracy of the substrate 10 can be maintained high. This is because regarding a-plane which is one of the plane-orientations of the GaN crystal that can be taken, the atomic bonding density per unit area is larger (the bond between the atoms is stronger) than that of the M-plane, or the like. However, this can also be a factor that a-plane is relatively difficult to be cleaved. In response to such a problem, in this embodiment, as described above, a cleavage work is performed after the recessed grooves (scribe grooves) are formed on the back surface of the substrate 5. This makes it possible to accurately cleave the substrate 5 in a cleavage weak plane (a plane difficult to be cleaved) orientation excluding M-plane. FIG. 1E shows a lateral surface configuration view of the substrate 10 obtained by the abovementioned technique. As shown in FIG. 1E, a melted plane (laser machined plane) or a cut plane (mechanically machined plane) generated by forming the recessed grooves on the back surface of the substrate 5, and a cleavage plane generated by cleaving the substrate 5 along the recessed grooves, are formed on the lateral surface of the substrate 10. The term of "melted plane" as used herein refers to a plane including an amorphous plane or the like formed by rapid solidification of a crystal after being melted once, for example. Further, the term of "cut plane" as used herein refers to a plane having a relatively large plane-roughness (roughness), namely, rough-plane (non-specular) including a dehisced plane or the like, for example.

It should be noted that the recessed grooves are provided to enhance a controllability when cleaving the substrate 5. Therefore, when forming the recessed grooves, it is necessary to adjust depths of the recessed grooves so that the substrate 5 is not completely cut (fully cut). The depth of the recessed groove is preferably set to a depth of 60% or more and 90% or less of the thickness T of the substrate 5. When the depth of the recessed groove is set to a depth less than 60% of the thickness T of the substrate 5, it is difficult to obtain a desired cleavage plane in some cases like a case in which the substrate 5 cracks along the highly cleavable M-plane. By setting the depth of the recessed groove to a depth of 60% or more of the thickness T of the substrate 5, the cleavage along the plane-orientation excluding M-plane, for example along the a-plane can be successfully performed, and a desired cleavage plane can be obtained. Further, when the depth of the recessed groove is set to a depth exceeding 90% of the thickness T of the substrate 5, a combining strength between the substrates 10 becomes insufficient due to an excessively small area of the cleavage plane, and it is difficult to make a freestanding state of the substrate 20 in some cases. By setting the depth of the recessed groove to a depth of 90% or less of the thickness T of the substrate 5, the area of the cleavage plane can be sufficiently secured and the combining strength between the substrates 10 can be increased.

According to intensive studies by inventors of the present disclosure, it is found that the cleavage of the substrate 5 using the recessed groove can be performed not only in a linear portion but also in an arc portion. Therefore, when obtaining at least one of the plurality of substrates 10 constituting the peripheral portion (arc portion) of the substrate 20, all lateral surfaces (linear and arc-shaped lateral surfaces) thereof are preferably formed by the cleavage work using the recessed grooves. In this case, it is possible to improve a quality of a crystal film grown on the substrate 20 over an entire in-plane area, namely, on the peripheral portion as well.

In order to accurately control a cleavage position, it is preferable that a sectional shape of the recessed groove is a V-like shape (a tapered shape with a wide opening) as shown in FIG. 1B. An opening width of the recessed groove is not particularly limited, but is exemplified by 0.2 to 1.8 mm, for example. By controlling the size and shape of the grooves in this way, a width of the cleavage plane (a width in a thickness direction) formed when the substrate 5 is cleaved, can be sufficiently secured while enhancing the controllability in cleaving the substrate 5. This makes it possible to increase the combining strength of the adjacent substrates 10 and improve a quality of the crystal film grown around the combined portion between the substrates 10, in step 3 described later.

When the abovementioned processing is performed, a large amount of cutting powder or dust of the substrate 5 is generated and attaches to the substrate 10, and in this state, a crystal growth described later may be adversely affected. Therefore, a cleaning process for removing cutting powder or dust is performed. For example, bubbling cleaning using a chemical solution obtained by mixing hydrogen chloride (HCl) and hydrogen peroxide water ($H_2O_2$) in a ratio of 1:1 can be given as a technique of performing cleaning.

(Step 2: Arrangement of Seed Crystal Substrates)

After the plurality of substrates 10 are obtained, step 2 is performed. In this step, the plurality of substrates 10 made of GaN crystals are arranged in a planar appearance and in a disc shape (tessellation), so that the main surfaces of the substrates 10 are parallel to each other and adjacent lateral surfaces are opposed to (in contact with) each other, namely, the lateral surfaces of the adjacent substrates 10 are opposed to (in contact with) each other.

FIG. 2A is a planar view showing an example of an arrangement pattern of the substrates 10. In the case of using the substrate 10 having a regular hexagonal planar shape as in this embodiment, the honeycomb pattern is formed by filling the substrates 10 in a plane. At least one of the plurality of substrates constituting a portion excluding a peripheral portion of the substrate 20 has a main surface formed into a regular hexagonal planar shape. As shown in FIG. 2A, when the substrate 20 is rotated once, with an axis passing through a center of the main surface of the substrate 20 and orthogonal to the main surface as a central axis, the honeycomb pattern obtained by matching the main surfaces of the substrates 10 is arranged so as to have two-fold or more rotational symmetry, and six-fold rotational symmetry in this example.

As shown in FIG. 2A, it is found that a substrate 10 arbitrarily selected from the plurality of arranged substrates 10 is configured so as to oppose to at least two or more other substrates 10. Further, it is also found that the lateral surfaces of the substrates 10 are configured so as not to be orthogonal to each other. It can be said that these events are specific to a case in which the planar shape of the substrate 10 takes, for example, a regular hexagon, an equilateral triangle, a parallelogram, or a trapezoid, and the plurality of substrates 10 are arranged in a planar appearance and in almost a circle (not only in one direction but also in multi-directions) as shown in FIG. 2A. Further, as shown in FIG. 2A, it is found that the plurality of substrates 10 are arranged so that they are mutually fitted with each other (in a matching state) in planar view and the misalignment of the substrates 10 hardly occurs in step 3 and in the subsequent step. It can be said that this event is specific to a case in which the substrate 10 has a regular hexagonal planar shape, and the plurality of substrates 10 are arranged in a planar appearance and in almost a circle as shown in FIG. 2A.

The description: "a plurality of substrates 10 are arranged so that their main surfaces are parallel to each other" includes not only a case in which the main surfaces of the adjacent substrates 10 are arranged completely in the same surface, but also a case in which there is a slight difference in heights of these surfaces and a case in which these surfaces are arranged with a slight inclination with respect to each other. Namely, this description shows a case in which the plurality of substrates 10 are arranged so that the main surfaces of them are arranged in the same heights and in parallel to each other as much as possible. However, even in a case that there are differences in the heights of the main surfaces of the adjacent substrates 10, the size of each difference is preferably set to 100 µm or less for example at largest, and more preferably set to 50 µm or less. Further, even in a case that the inclination occurs in the main surfaces of the adjacent substrates 10, the size of the inclination is preferably set to 1° or less for example in the largest surface, and more preferably set to 0.5° or less. Further, when the plurality of substrates 10 are arranged, the variation of the off-angles in the main surface (difference between a maximum value and a minimum value of the off-angle in the entire main surface) of the substrate group obtained by arranging the plurality of substrates 10, is preferably set to 0.3° or less for example, and more preferably set to 0.15° or less. This is because when the variation of the off-angles, difference in the heights of the main surfaces of the adjacent substrates 10, and the inclination between the main surfaces of the substrates 10 are too large, there is sometimes a possibility of deteriorating a quality of the crystal grown in steps 3 and 5 (crystal growth step) described later.

Further, the description: "a plurality of substrates 10 are arranged so that adjacent lateral surfaces are opposed to each other" shows a case in which the plurality of substrates 10 are arranged such that these substrates 10 are opposed in proximity to each other so as not to allow the gap to occur between the lateral surfaces of the adjacent substrates 10. Namely, this description shows not only a case in which the lateral surfaces of the adjacent substrates 10 are completely in contact with each other without gaps, but also a case in which there are slight gaps between them. However, even when the gap occurs between the lateral surfaces of the adjacent substrates 10, the size of the gap in a room temperature condition is preferably set to 100 µm or less for example at largest, and more preferably set to 50 µm or less. This is because when the gap is too large, there is a case in which the adjacent substrates 10 are not combined, or the strength of combining them is insufficient even in a case that they are combined, when step 3 (crystal growth step) described later is performed. Further, in order to increase the combining strength between the adjacent substrates 10 after step 3 is performed, it is preferable to arrange the adjacent substrates 10 such that at least cleavage planes of the lateral surfaces of the adjacent substrates 10 are in contact with each other.

Figure 2B:
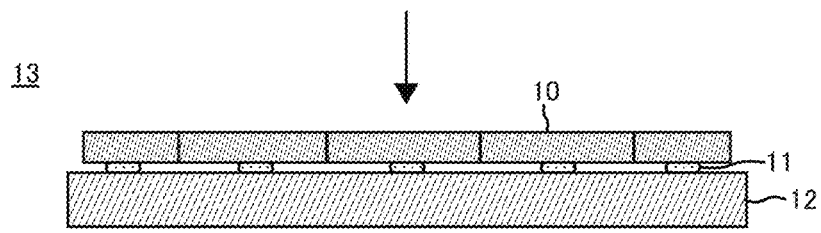
FIG. 2B is a cross-sectional view taken along a line B-B' of the assembled substrate 13 shown in FIG. 2A.

In order to facilitate handling in step 3, the plurality of substrates 10 are preferably fixed on a holding plate (support plate) 12 formed as a flat plate, for example. FIG. 2B shows a cross-sectional configuration of an assembled substrate 13 formed by adhering the plurality of substrates 10 onto the holding plate 12 through an adhesive agent 11. As shown in this figure, the substrates 10 are placed on the holding plate 12 through a layer made of the adhesive agent 11 so that the main surfaces (crystal growth surfaces) of the substrates 10 are faced upward. In other words, the layer made of the adhesive agent 11 is provided between the substrates 10 and the holding plate 12.

As a material of the holding plate 12, it is preferable to use a material having a heat-resistance and a corrosion resistance which can withstand a film-formation temperature and a film-formation atmosphere in step 3 (crystal growth step) described later, and having a linear expansion coefficient equal to or smaller than that of the crystal constituting the substrates 10 and a GaN crystal film 14 (also referred to as GaN film 14) formed in step 3. By using such a material as the material of the holding plate 12, it is possible to suppress a formation of a gap between the substrates 10 in step 3 and a spreading of the gap formed between the substrates 10. Here, the linear expansion coefficient means the coefficient of linear expansion in a direction parallel to the main surface (c-plane) of the substrate 10, namely, means the coefficient of linear expansion in a-axis direction of the GaN crystal constituting the substrate 10. The linear expansion coefficient of the GaN crystal in the a-axis direction is $5.59 \times 10^{-6}$/K. As materials exhibiting the linear expansion coefficient equal to or smaller than the above value, inexpensive, easy to obtain, and exhibiting a certain degree of rigidity, for example, isotropic graphite, anisotropic graphite (pyrolytic graphite (also referred to as PG hereafter) etc.), silicon (Si), quartz, silicon carbide (SiC), or the like, can be given. Above all, PG from which a surface layer is likely to peel off, can be particularly preferably used, for the reason which will be described later. Further, it is also possible to suitably use a composite material obtained by coating a surface of a flat base plate made of at least any one of isotropic graphite, Si, quartz, SiC or the like, with a material such as PG which is easily peelable and has an excellent corrosion resistance.

As a material of the adhesive agent 11, it is possible to suitably use a material which solidifies by being held for a predetermined time under a temperature condition far lower than the film-formation temperature in step 3, for example, a material which solidifies by being dried for several minutes to several tens of hours under the temperature condition within a range from ordinary temperature to 300° C. By using such a material as the material of the adhesive agent 11, it is possible to finely adjust a position, a height, an inclination or the like of the substrates 10 arranged on the holding plate 12 until the adhesive agent 11 is solidified. For example, when there is a difference in the heights between the main surfaces of the substrates 10, or when there is the inclination between the main surfaces of the substrates 10, the height and the inclination of the plurality of substrates 10 can be finely adjusted so that the main surfaces thereof are parallel to each other, by pressing a plate such as a glass plate previously confirmed to be flat, against the main surface group of the plurality of substrates 10 arranged on the holding plate 12. Further, solidification of the adhesive agent 11 (fixture of the substrates 10) can be completed under a relatively low temperature condition before starting step 3, thus making it possible to start step 3 in a state of suppressing the misalignment of the substrates 10. As a result thereof, a quality of the GaN film 14 to be grown in step 3 can be improved and the combining strength between the substrates 10 can be increased. In addition, an adhering work for adhering the substrates 10 can be performed for example manually, and a simplicity of the adhering work can be remarkably improved and an equipment required for the adhering work can be simplified.

Further, as the material of the adhesive agent 11, it is preferable to use a material having a heat-resistance and a corrosion resistance which can withstand the film-formation temperature and the film-formation atmosphere in step 3 (crystal growth step) described later. By using such a material as the material of the adhesive agent 11, it is possible to prevent the adhesive agent 11 from thermally decomposing or the like, resulting in releasing the fixture of the substrates 10 during a temperature rise in step 3. In addition, by growing the GaN film 14 while insufficiently fixing the substrates 10, it is possible to avoid occurrence of warping in the finally obtained substrate 20. It is also possible to avoid a contamination of a growing atmosphere due to the thermal decomposition of the adhesive agent 11, thereby making it possible to prevent a deterioration of the quality of the GaN film 14 and a decrease of the combining strength between the substrates 10.

As the material of the adhesive agent 11, it is preferable to use a material having a linear expansion coefficient close to that of the substrate 10 or the crystal constituting the GaN film 14 grown in step 3. The description: "the linear expansion coefficient is close" means that the linear expansion coefficient of the adhesive agent 11 is substantially equal to the linear expansion coefficient of the crystal constituting the GaN film 14, for example, a difference between the linear expansion coefficients of them is within 10%. By using such a material as the material of the adhesive agent 11, it is possible to relax a stress applied in the in-plane direction of the substrate 10 due to the difference in the linear expansion coefficients between the substrates 10 or the crystal constituting the GaN film 14 and the adhesive agent 11 when step 3 described later is performed, and it is possible to avoid occurrence of warping, cracks, or the like in the substrate 10.

As the material of the adhesive agent 11 satisfying these requirements, for example, a heat-resistant inorganic adhesive agent mainly composed of a heat-resistant (fire-resistant) ceramics and an inorganic polymer can be used, and in particular, a material mainly composed of zirconia, silica, etc., can be preferably used. Examples of such adhesive agents include commercially available Aron Ceramic C agent and E agent (Aron Ceramic is a registered trademark of Toagosei Co., Ltd.). It is already confirmed that these adhesive agents form a cured material having a heat-resistance to a high temperature of 1100° C. to 1200° C. by drying and solidifying at a temperature in a range of, for example, ordinary temperature to 300° C., and the adhesive agents have a high corrosion resistance which can withstand the film-formation atmosphere in step 3, and have a high adhesion strength so as not to cause the misalignment of the substrates 10 or the like. Further, it is also confirmed that the above adhesive agent does not affect the crystal grown on the substrate 10. In addition, since the above adhesive agent has an appropriate viscosity of, for example, about 40000 to 80000 mPa·s at ordinary temperature in a stage before solidification, it is also already confirmed that the above adhesive agent is significantly suitable when temporarily fastening or aligning the substrates 10 on the holding plate 12.

When the substrate 10 is adhered onto the holding plate 12, in order to prevent the adhesive agent 11 from wrapping around toward the main surface of the substrate 10 and protruding therefrom, it is preferable to apply the adhesive agent 11 to a region excluding at least a peripheral portion of the substrate 10, for example, a region apart from the peripheral portion by a predetermined width, and preferably only in the vicinity of the center. When the adhesive agent 11 wraps around to the main surface side, the quality of the GaN film 14 may be significantly deteriorated or the growth of the GaN film 14 may be hindered in the wraparound portion and a surrounding portion thereof. A surface of the holding plate 12 may have a configuration to prevent the adhesive agent 11 from wrapping around. For example, by forming recessed grooves on the surface of the holding plate 12 positioned below the peripheral portion of the substrates 10, and allowing the adhesive agent 11 which becomes excessive when adhering the substrates 10, to escape into the recessed grooves, it is possible to suppress the wraparound of the adhesive agent 11 toward the main surface of the substrate 10.

When there is a difference between the linear expansion coefficient of the holding plate 12 and the linear expansion coefficient of the substrate 10, particularly when the difference therebetween is large, it is preferable to limit an amount of the adhesive agent 11 applied to a back surface side of the substrates 10 to "extremely small amount". This is because the adjacent substrates 10 arranged on the holding plate 12 are combined with each other by performing step 3. After integrating (combining) the plurality of substrates 10 to obtain the substrate 20, temperatures of the substrate 20 and the holding plate 12 are decreased from the film-formation temperature to, for example, around ordinary temperature. When there is the above difference in the linear expansion coefficients between the holding plate 12 and the substrate 10, a tensile stress or a compressive stress is applied in an in-plane direction of the substrate 20 due to a difference in thermal contraction amounts of these members. Depending on the difference in the linear expansion coefficients, a large stress is applied in the in-plane direction of the substrate 20, which may cause cracks or the like in the substrates 10 constituting the substrate 20 or the combined portion. In response to such a problem, the inventor of the present invention has found that it is very effective to appropriately limit the amount of the adhesive agent 11. This is because by appropriately limiting the amount of the adhesive agent 11, when the abovementioned stress is applied in the in-plane direction of the substrate 20, the solidified adhesive agent 11 can be broken at an appropriate timing, or the fixed adhesive agent 11 can be peeled off from the substrate 10 or the holding plate 12, whereby fracture or the like of the substrate 10 can be avoided. Therefore, the term of "extremely small amount" used herein means an amount that can have a predetermined width, such as an amount capable of preventing the fixture of the substrate 10 onto the holding plate 12 and preventing the misalignment of the substrate 10 at least in proceeding step 3, and an amount capable of avoiding the fracture of the substrate 10 or the like, by breaking or peeling off the adhesive agent 11 which is in a solidified state, when the stress is applied to the substrate 20 at the time of a temperature decrease due to the difference in the abovementioned linear expansion coefficients.

Even when there is no difference in the linear expansion coefficients between the holding plate 12 and the substrate 10, or even when the difference therebetween is very small, it is preferable to set the amount of the adhesive agent 11 to the abovementioned "extremely small amount" when there is a difference in the linear expansion coefficients between the adhesive agent 11 and the substrate 10, and particularly when such a difference is large. This makes it possible to relax the stress applied in the in-plane direction of the substrate 10 due to the difference in the linear expansion coefficients between the adhesive agent 11 and the substrate 10, thereby making it possible to avoid occurrence of warping, cracks, or the like, in the substrate 10.

When the amount of the adhesive agent 11 is limited to the extremely small amount, it is preferable to apply the adhesive agent 11 to a central portion of the substrate 10. It is easier to adjust a posture of the substrate 10 or to maintain the posture by applying the adhesive agent 11 to the central portion of the substrate 10 rather than to a region excluding the central portion of the substrate 10. In addition, it is possible to reliably suppress the wraparound of the adhesive agent 11 toward the main surface of the substrate 10. Further, when the temperature of each substrate 10 adhered onto the holding plate 12 is raised or decreased in step 3 or the like described later, each substrate 10 expands or contracts in a circumferential direction at a point adhered by the adhesive agent 11 as a base point. In this case, by adhering the adhesive agent 11 onto the central portion of the substrate 10, it is possible to make the gaps between the adjacent substrates 10 uniform in an in-plane area of the substrate 20. Further, when there is no gap between the adjacent substrates 10, it is possible to make a distribution of the stress applied to the lateral surfaces (contact surfaces) of the adjacent substrates 10 uniform in the in-plane area of the substrate 20. The term of "central portion of the substrate 10" used herein is not necessarily limited to a geometric center of the substrate 10, and includes a region including the geometric center of the substrate 10 or a region in the vicinity thereof although the geometric center of the substrate 10 is not included.

By arranging the substrate 10 on the holding plate 12 through the adhesive agent 11 and solidifying the adhesive agent 11, preparation of the assembled substrate 13 is completed. In order to complete the solidification of the adhesive agent 11 in a state in which the main surfaces of the plurality of substrates 10 are parallel to each other and the lateral surfaces of the adjacent substrates 10 are in contact with each other, it is preferable to adjust positions, inclinations, and heights of the substrates 10 respectively, as needed, until the adhesive agent 11 is solidified. The solidification of the adhesive agent 11 is preferably completed before starting step 3. Thereby, an input of the assembled substrate 13 into HVPE apparatus 200 and a crystal growth described later can be performed respectively in a state in which the misalignment of the plurality of substrates 10 is suppressed.

This assembled substrate 13, namely, the assembled substrate 13 in a state before the GaN film 14 is grown described later can also be considered as an aspect of the substrate 20 in this embodiment. Namely, it is acceptable that a GaN crystal film 21 (also referred to as GaN film 21 hereafter) described later is grown thick on a main surface (crystal growth surface) of the assembled substrate 13 obtained here using a hydride vapor phase epitaxy (HVPE) method, the thickly grown GaN film 21 is then sliced, to thereby obtain a plurality of GaN substrates 30. However, it is preferable to prepare a freestandable combining substrate formed by combining the plurality of substrates 10 with the GaN film 14 by performing step 3 described later, and to use the freestandable combining substrate as the substrate 20, from viewpoints that the misalignment of the substrate 10 or the like can be reliably prevented and a handling of the substrate 20 can be facilitated.

(Step 3: Combination by Crystal Growth)

After the adhesive agent 11 is solidified and the preparation of the assembled substrate 13 is completed, the GaN film 14 which is a first crystal film (thin film for combination) is grown on the surface of the plurality of substrates 10 arranged in a planar appearance, using a Hydride Vapor Phase Epitaxy (HVPE) apparatus 200 shown in FIG. 5.

The HVPE apparatus 200 includes an airtight container 203 which is made of a heat-resistant material such as quartz, and which has a film-formation chamber 201 formed therein. A susceptor 208 is provided in the film-formation chamber 201, for holding the assembled substrate 13 and the substrate 20. The susceptor 208 is connected to a rotating shaft 215 of a rotation mechanism 216, and is configured to be rotatable. Gas supply pipes 232a to 232c are connected to one end of the airtight container 203, for supplying HCl gas, ammonia ($NH_3$) gas as a nitriding agent, and nitrogen ($N_2$) gas into the film-formation chamber 201. A gas supply pipe 232d is connected to the gas supply pipe 232c, for supplying hydrogen ($H_2$) gas. Flow rate controllers 241a to 241d, and valves 243a to 243d are respectively provided on the gas supply pipes 232a to 232d in this order from an upstream side. A gas generator 233a is provided on a downstream side of the gas supply pipe 232a, for containing Ga melt as a raw material. A nozzle 249a is connected to the gas generator 233a, for supplying gallium chloride (GaCl) gas generated by a reaction between HCl gas and the Ga melt toward the assembled substrate 13, etc., held on the susceptor 208. Nozzles 249b and 249c are respectively connected to the downstream side of the gas supply pipes 232b and 232c, for supplying various gases supplied from these gas supply pipes toward the assembled substrate 13, etc., held on the susceptor 208. An exhaust pipe 230 is provided on the other end of the airtight container 203, for exhausting an inside of the film-formation chamber 201. A pump 231 is provided to the exhaust pipe 230. A zone heater 207 is provided on an outer periphery of the airtight container 203, for heating an inside of the gas generator 233a and the assembled substrate 13, etc., held on the susceptor 208, to a desired temperature. A temperature sensor 209 is provided in the airtight container 203, for measuring a temperature inside of the film-formation chamber 201. Each member of the HVPE apparatus 200 is connected to a controller 280 configured as a computer, and is configured to control processing procedures and processing conditions described later, based on a program executed by the controller 280.

Step 3 can be performed using the abovementioned HVPE apparatus 200, for example by the following processing procedure. First, Ga polycrystal is put in the gas generator 233a as a raw material, and the assembled substrate 13 is input (loaded) into the airtight container 203 and placed on the susceptor 208. Then, $H_2$ gas (or a mixed gas of $H_2$ gas and $N_2$ gas) is supplied into the film-formation chamber 201, while heating and exhausting the inside of the film-formation chamber 201. Thereafter, when a temperature and a pressure in the film-formation chamber 201 reaches a desired temperature and a desired pressure, and a temperature of the assembled substrate 13 reaches a desired film-formation temperature, gasses are supplied from the gas supply pipes 232a and 232b, and then GaCl gas and $NH_3$ gas are supplied as film-formation gases toward the main surface (front surface) of the assembled substrate 13 (substrates 10) in a state in which an atmosphere in the film-formation chamber 201 is maintained in a desired atmosphere. As a result, as shown in a cross-sectional view of FIG. 6A, GaN crystal is epitaxially grown on the surface of the substrates 10, and the GaN film 14 is formed thereon. Owing to the formation of the GaN film 14, the adjacent substrates 10 are combined with each other by the GaN film 14, and formed into an integral state. As a result, the substrate 20 formed by combining the adjacent substrates 10 can be obtained. In order to prevent decomposition of the crystals constituting the substrates 10 in the film-formation process, $NH_3$ gas is preferably supplied prior to HCl gas, for example before heating the inside of the film-formation chamber 201. Further, in order to increase an in-plane uniformity of a thickness (film thickness) of the GaN film 14 and increase the combining strength between the adjacent substrates 10 evenly in the in-plane area, step 3 is preferably performed in a state of rotating the susceptor 208.

Step 3 is performed based on the following processing conditions for example:
Film-formation temperature (temperature of the assembled substrate 13): 980 to 1100° C., and preferably 1050 to 1100° C.
Film-formation pressure (pressure in the film-formation chamber 201): 90 to 105 kPa, and preferably 90 to 95 kPa
Partial pressure of GaCl gas: 1.5 to 15 kPa
Partial pressure of $NH_3$ gas/partial pressure of GaCl gas: 2 to 6
Partial pressure of $N_2$ gas/partial pressure of $H_2$ gas: 1 to 20

The thickness of the GaN film 14 is appropriately selected from a film thickness range having a predetermined width in accordance with a purpose. For example, the GaN film 14 can be set to a thickness of 3D μm or more, preferably 10 D μm or more, when an outer diameter of the substrate 20 is set to D cm. When the thickness of the GaN film 14 is less than 3D μm, a force of combining the adjacent substrates 10 is insufficient, and the freestanding state of the substrate 20 cannot be maintained, and the step thereafter cannot be performed.

There is no particular upper limit in the thickness of the GaN film 14, but the crystal growth carried out here may be limited to the purpose of simply making the plurality of combined substrates 10 in a freestanding state. In other words, the thickness of the GaN film 14 is preferably limited to a minimum necessary thickness for maintaining a combined state of the adjacent substrates 10, namely, for maintaining the freestanding state of the substrate 20, even when the substrate 20 composed of the mutually combined substrates 10 is removed from the holding plate 12 and subjected to cleaning, etc., in step 4 (peeling of the holding plate and cleaning) described later. As described in this embodiment, if step 5 is separately performed as a full-scale crystal growth step, waste of various gases used for film formation, or reduction of a productivity of the GaN substrate in total, is caused in some cases when the GaN film 14 to be grown in step 3 becomes excessively thick. From such a viewpoint, the GaN film 14 may be set to a thickness of 100 D μm or less when the outer diameter of the substrate 20 is set to D cm.

From these facts, in this embodiment, when the outer diameter of the substrate 10 is 2 inches and the outer diameter of the substrate 20 is 6 to 8 inches, the thickness of the GaN film 14 can be set in a range of 450 μm or more and 2 mm or less for example, preferably 150 μm or more and 2 mm or less.

When the substrates 10 are combined by the GaN film 14, all lateral surfaces of the substrates 10 opposed to lateral surfaces of other substrates 10 are M-planes or a-planes, and are planes in the same orientation with each other, thereby making it possible to increase the strength of combining them. When the thicknesses of the GaN films 14 are the same, the combining strength between the substrates 10 can be increased by combining the adjacent substrates 10 with M-planes or a-planes, particularly a-planes, as compared with the case in which the adjacent substrates 10 are combined with planes excluding "M-plane or a-plane".

(Step 4: Peeling of the Holding Plate and Cleaning)

After the growth of the GaN film 14 is completed and the adjacent substrates 10 are in a state of being combined with each other, supplies of HCl gas into the gas generator 233a and $H_2$ gas into the film-formation chamber 201, and heating by the heater 207, are respectively stopped in a state of supplying $NH_3$ gas and $N_2$ gas into the film-formation chamber 201 and exhausting the inside of the film-formation chamber 201. The temperature in the film-formation chamber 201 becomes 500° C. or less, supply of $NH_3$ gas is then stopped, and thereafter an atmosphere in the film-formation chamber 201 is replaced with $N_2$ gas and is returned to an atmospheric pressure, and the temperature in the film-formation chamber 201 is decreased to a temperature for unloading the assembled substrate 13 therefrom. After such a temperature is decreased, the assembled substrate 13 is unloaded from the film-formation chamber 201.

Thereafter, the substrate 20 formed by combining the adjacent substrates 10 is peeled off from the holding plate 12, and the substrate 20 is separated from the holding plate 12 (the substrate 20 is set in the freestanding state).

When a material such as PG (a material from which a surface layer is more easily peeled off than the substrate 10) is used as the material of the holding plate 12, as shown in FIG. 6B, a surface layer of the holding plate 12 is thinly peeled off as a sacrificial layer (peel off layer) 12a, to thereby make it easy to make the freestanding state of the substrate 20 from the holding plate 12. The same effect can be obtained also when a composite material is used as the material of the holding plate 12, the composite material being obtained by coating a surface of a flat base plate made of isotropic graphite, etc., with PG or the like. Although it is more expensive than PG, the same effect can be obtained even when pyrolytic boron nitride (PBN) is used as the material of the holding plate 12. In addition, even when a material such as isotropic graphite, Si, quartz, SiC, is used, namely, even when a material that cannot act as the sacrificial layer for the surface layer is used as the material of the holding plate 12, the solidified adhesive agent 11 can be broken or peeled off at an appropriate timing by setting the amount of the adhesive agent 11 to the extremely small amount as described above, when the above stress is applied in the in-plane direction of the substrate 20. As a result, the substrate 20 can be easily in the freestanding state from the holding plate 12.

The adhesive agent 11 and the sacrificial layer 12a adhered onto a back surface of the freestanding substrate 20 (a back surface of the substrate 10) are removed using a cleaning agent such as an aqueous hydrogen fluoride (HF). As a result, the substrate 20 in the freestanding state as shown in FIG. 6C is obtained. The main surface of the substrate 20 (a surface of the GaN film 14) is used as a base surface for crystal growth, and the substrate 20 is sometimes distributed in the market as a large diameter substrate having a diameter of 100 mm or more and further exceeding 150 mm (6 inches). Until polishing of the back surface of the substrate 20 is performed, trace of adhesion of residual components of the adhesive agent 11 or the sacrificial layer 12a may be left on the back surface of the substrate 10 even after the cleaning thereof.

(Step 5: Crystal Growth and Slicing)

In this step, the GaN film 21 which is a second crystal film (full growth film) is grown on the main surface of the freestanding substrate 20, using the HVPE apparatus 200 shown in FIG. 5, and by the same processing procedure as the processing procedure of step 3. FIG. 7B shows a state in which the GaN film 21 is formed thick by the vapor phase growth method on the main surface of the substrate 20, namely, on the surface of the GaN film 14.

The processing procedure of this step is almost the same as step 3, but as shown in FIG. 7A, this step is performed in a state that the substrate 20 configured to be freestandable is placed directly on the susceptor 208. Namely, this step is performed in a state in which the holding plate 12 and the adhesive agent 11 do not exist between the substrate 20 and the susceptor 208. Therefore, heat transfer between the susceptor 208 and the substrate 20 is efficiently achieved, and it is possible to shorten the time required for raising and decreasing the temperature of the substrate 20. In addition, since the entire back surface of the substrate 20 is in contact with the susceptor 208, the substrate 20 is uniformly heated over the entire in-plane area thereof. As a result, it becomes possible to equalize the temperature condition in the main surface of the substrate 20, namely, in the crystal growth surface over the entire in-plane area thereof. In addition, since heat treatment is performed in a state in which the adjacent substrates 10 are integrally combined with each other, direct heat transfer (heat exchange) between the adjacent substrates 10, namely, heat conduction in the substrate 20 is promptly achieved. As a result, it becomes possible to make the temperature condition on the crystal growth surface more uniform over the entire in-plane area thereof. Namely, in this step, since the crystal growth is carried out using the substrate 20 configured to be freestandable, the productivity of crystal growth can be improved and an in-plane uniformity or the like of crystals grown on the substrate 20 can be increased.

In contrast, as exemplified in FIG. 11A, an alternative method is conceivable as follows: a plurality of seed crystal substrates are arranged and adhered onto a holding plate with an adhesive agent interposed therebetween, and while maintaining such a state, crystals are then grown on these seed crystal substrates, and the crystal growth is continued, to thereby integrate multiple crystals. Namely, it is also conceivable that there is a method of performing a fully-growing step without performing a step of making a freestanding state of the substrate as shown in the present disclosure. However, in this alternative method, it may be difficult to obtain some effects out of the various effects described above. This is because in this method, heat transfer from a susceptor to the seed crystal substrates may be hindered by the holding plate and the adhesive agent interposed therebetween, and there is a problem that a heating efficiency or a cooling efficiency of the substrate is easily reduced in the fully-growing step or the like. Also, in this method, an efficiency of the heat transfer from the susceptor toward the substrate is greatly affected by an application amount and an application position or the like of the adhesive agent, and therefore in this alternative method, there is also a problem that the heating efficiency or the cooling efficiency between the substrates may be uneven (a uniformity of the heating efficiency or the cooling efficiency is easily reduced). Further, when the plurality of seed crystal substrates are arranged so that the adjacent seed crystal substrates are separated from each other (when the adjacent seed crystal substrates are not integrally combined), direct heat transfer (heat exchange) between these seed crystal substrates is difficult to occur, and as a result, there is also a problem that the temperature condition on the crystal growth surface may be uneven between the seed crystal substrates, and an in-plane uniformity of a temperature of the substrate is easily reduced. As a result thereof, according to this alternative method, the productivity of crystal growth may be reduced, or an in-plane uniformity of the finally obtained crystals may be deteriorated, as compared with the method of this embodiment.

Figure 11A:
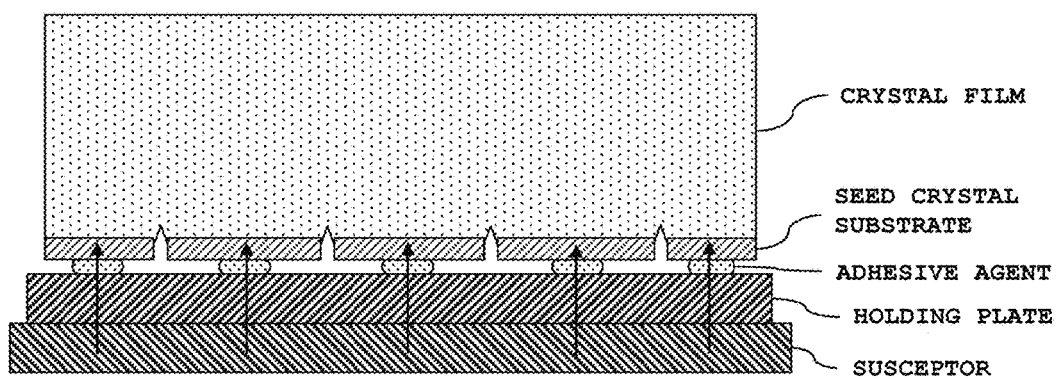
FIG. 11A is a pattern diagram showing a comparative example of a crystal growth method.

Therefore, it can be said that the crystal growth method of this embodiment using the substrate 20 configured to be freestandable, provides a great advantage in improving the productivity and the quality, as compared with the alternative method exemplified in FIG. 11A. In this embodiment, heating of the substrate 20 configured to be freestandable may be performed in a state in which the substrate 20 is placed on a jig such as a substrate supporting member placed on the susceptor 208. A substrate placement surface of the jig is preferably formed flat. Even in this case, since heating of the substrate 20 is performed in a state in which the adhesive agent 11 does not exist between the substrate 20 and the susceptor 208, it is possible to improve the productivity of crystal growth and the in-plane uniformity of the finally obtained crystals as compared with the alternative method as exemplified in FIG. 11A.

Further, in order to avoid a variation of the application amount and the application position of the adhesive agent, as exemplified in FIG. 11B, a further alternative method is also conceivable as follows: an adhesive layer is provided on the holding plate with an even thickness, and seed crystal substrates are arranged on the adhesive layer in a plane. However, in this method, in order to avoid an adverse effect by the adhesive layer on the crystals to be grown in the fully-growing step, for example, a diffusion of a component contained in the adhesive layer toward the crystals, or the like, it is necessary to provide an engraved portion at a combined portion between the seed crystal substrates and remove the adhesive layer, or to block an influence of the adhesive agent (adhesive layer) by providing a mask at the combined portion as exemplified in FIG. 11C. Therefore, there is sometimes a risk of causing a complicated manufacturing process or a higher manufacturing cost. Further, in the abovementioned method of providing the engraved portion, a low heat conductivity void (an airspace) is formed between the seed crystal substrates, and therefore heat exchange between the seed crystal substrates is difficult to occur, and a temperature uniformity between the seed crystal substrates is likely to reduce. As a result, there is sometimes a risk of adversely affecting the crystals to be grown in the fully-growing step, for example, deteriorating an in-plane uniformity of a crystallinity or decreasing an in-plane uniformity of a growth rate, etc.

Figure 11B:
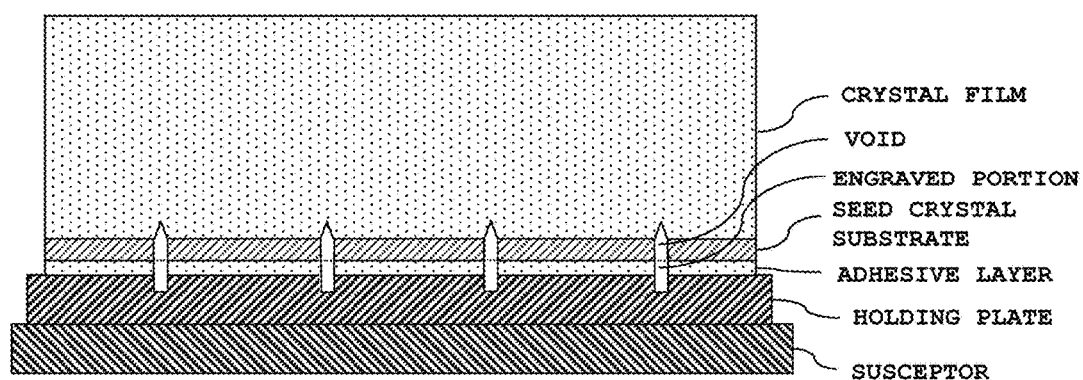
FIG. 11B is a pattern diagram showing another comparative example of the crystal growth method.
Figure 11C:
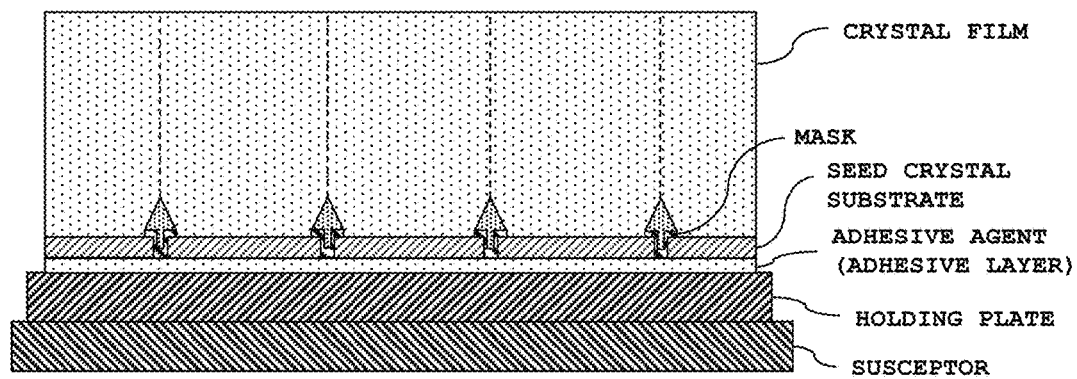
FIG. 11C is a pattern diagram showing further another comparative example of the crystal growth method.

Therefore, it can be said that the crystal growth method of this embodiment using the substrate 20 configured to be freestanding, provides a great advantage in improving the productivity and the quality, as compared with the alternative method exemplified in FIGS. 11A to 11C.

Although the processing condition in step 5 can be the same as the processing condition in step 3 described above, it is also possible to make them different from each other. This is because the film-formation process in step 3 is performed mainly for the purpose of combining the substrates 10. Therefore, in step 3, it is preferable to grow the crystals under a condition that emphasizes a growth in a direction along the main surface (c-plane) (creeping direction) rather than the growth toward a main surface direction (c-axis direction). In contrast, the film-formation process in step 5 is performed mainly for the purpose of growing the GaN film 21 at a high speed and thickly on the substrate 20. Therefore, in step 5, it is preferable to grow the crystals under a condition that emphasizes the growth toward the main surface direction rather than the growth toward the creeping direction.

As a method for achieving the abovementioned purpose, there is for example a method of making an atmosphere in the film-formation chamber 201 different between step 3 and step 5. For example, a ratio of a partial pressure of $N_2$ gas to a partial pressure of $H_2$ gas ($N_2/H_2$) in the film-formation chamber 201 in step 5 is set to be smaller than the ratio of the partial pressure of $N_2$ gas to the partial pressure of $H_2$ gas ($N_2/H_2$) in the film-formation chamber 201 in step 3. As a result, the crystal growth toward the creeping direction becomes relatively active in step 3, and the crystal growth toward the main surface direction becomes relatively active in step 5.

As another method for achieving the abovementioned purpose, there is for example a method of making the film-formation temperature different between step 3 and step 5. For example, the film-formation temperature in step 5 is set to be lower than the film-formation temperature in step 3. As a result, the crystal growth toward the creeping direction becomes relatively active in step 3, and the crystal growth toward the main surface direction becomes relatively active in step 5.

As further another method for achieving the abovementioned purpose, there is for example a method of making a ratio ($NH_3/GaCl$) of a supply flow rate of $NH_3$ gas to a supply flow rate of GaCl gas different between step 3 and step 5. For example, the $NH_3/GaCl$ ratio in step 5 is set to be larger than the $NH_3/GaCl$ ratio in step 3. As a result, the crystal growth toward the creeping direction becomes relatively active in step 3, and the crystal growth toward the main surface direction becomes relatively active in step 5.

Step 5 is performed based on the following processing conditions for example:
Film-formation temperature (temperature of the substrate 20): 980 to 1100° C.
Film-formation pressure (pressure in the film-formation chamber 201): 90 to 105 kPa, and preferably 90 to 95 kPa
Partial pressure of GaCl gas: 1.5 to 15 kPa
Partial pressure of $NH_3$ gas/partial pressure of GaCl gas: 4 to 20
Partial pressure of $N_2$ gas/partial pressure of $H_2$ gas: 0 to 1

After the GaN film 21 is grown up to a desired film thickness, the film-formation process is stopped by the processing procedure similar to the processing procedure when terminating step 3, and the substrate 20 with the GaN film 21 formed thereon, is unloaded from the film-formation chamber 201. Thereafter, by slicing the GaN film 21 in parallel to its growth surface, as shown in FIG. 7C, one or more GaN substrates 30 having a circular outer shape can be obtained. The GaN substrate 30 is also a circular substrate having a large diameter of 100 mm or more, and further exceeding 150 mm (6 inches). An entire laminated structure of the substrate 20 and the GaN film 21 can also be regarded as the GaN substrate 30. In addition, when the substrate 20 is cut out from the GaN film 21, it is also possible to re-perform step 5 using the cutout substrate 20, namely, to reuse the cutout substrate 20.

(2) Configuration of a Nitride Crystal Substrate

In this embodiment, one or more GaN substrates 30 having a configuration described later can be obtained by performing the abovementioned steps 1 to 5.
(High Dislocation Density Region and Low Dislocation Density Region)

Under an indirect influence of the combined portion between the substrates 10, the GaN substrate 30 sometimes has a high dislocation density region with a relatively high dislocation density, namely, a region with a relatively low strength or a relatively low quality. The high dislocation density region is a region having a dislocation density greater than an average dislocation density in the GaN film 21, namely, in the GaN substrate 30, more specifically a region having about one digit higher (an order of magnitude, i.e., a power of ten) dislocation density larger than an average dislocation density value. In contrast with such a high dislocation density region, a region having the average dislocation density is referred to as a low dislocation density region hereafter. The dislocation density value in each region will be described in detail later.
An existence of the high dislocation density region may be visible by a formation of grooves or steps on the surface of the substrate 30 or may not be visible. Even when the high dislocation density region is not visible, it is possible to confirm the existence thereof by observing the surface of the substrate 30 using a fluorescence microscope performing an ultraviolet irradiation in a case that for example an impurity concentration (particularly an oxygen concentration) of the high dislocation density region is high as described later. Further, even when the high dislocation density region is not visible and the impurity concentration is not high, it is possible to confirm the existence of the high dislocation density region by performing a detection by a cathode luminescence (CL) method using an electron beam for example.

Figure 9:
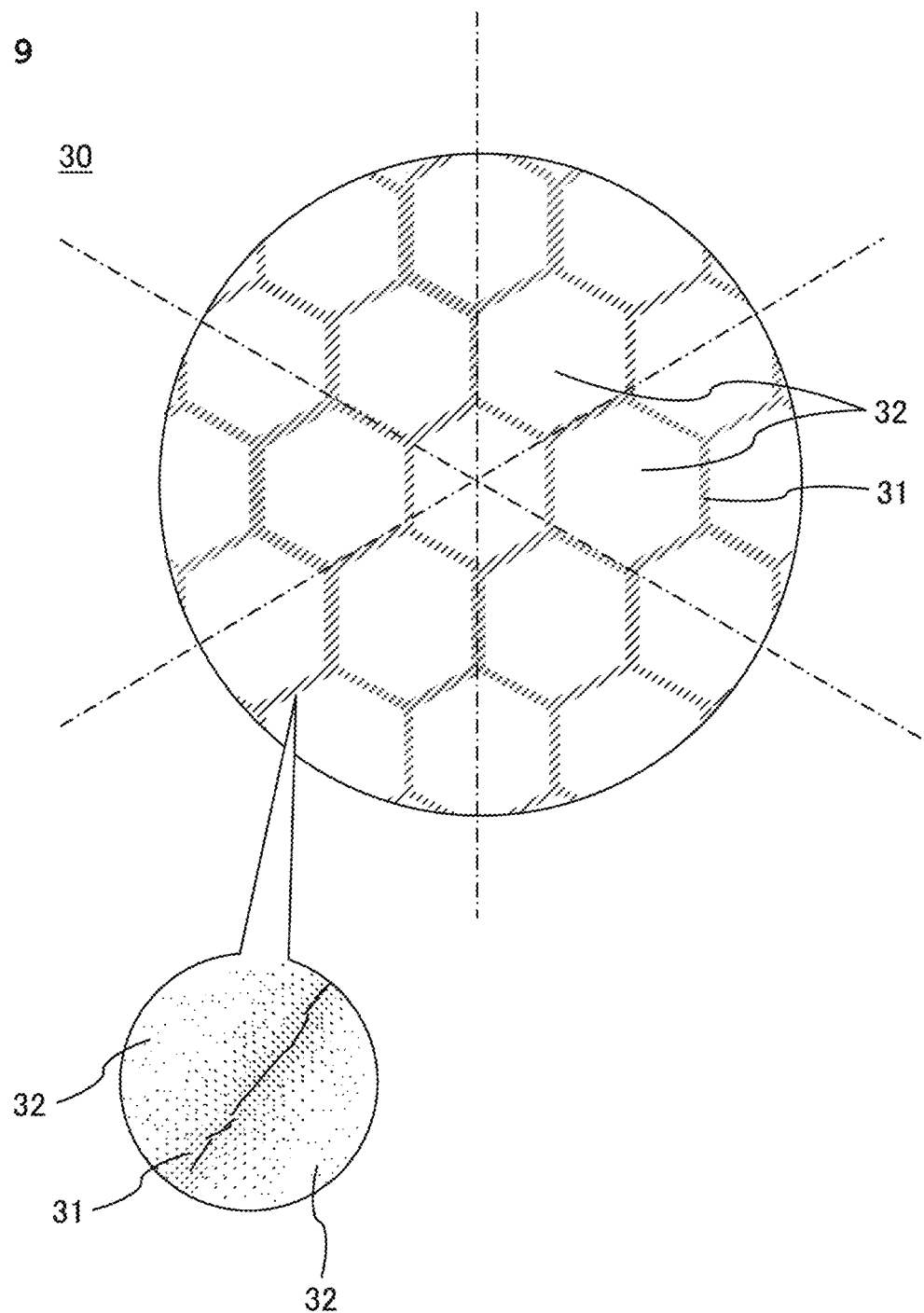
FIG. 9 is a pattern diagram exemplifying a planar configuration of the substrate 20 for crystal growth and the nitride crystal substrate 30 manufactured by using the substrate 20.

When the main surface of the substrate 10 is formed into a regular hexagonal planar shape as shown in this embodiment, the high dislocation density region of the GaN substrate 30 configurates a honeycomb pattern in which outlines of regular hexagonal planar shapes are matched as shown by shading in FIG. 9. As shown in FIG. 9, it can be said that the high defect region is formed so as to be continuous on the main surface of the GaN substrate 30, thereby dividing the low defect region existing on the main surface of the GaN substrate 30. Also, it can be said that such a honeycomb pattern has two-fold or more rotational symmetry, in this embodiment, six-fold rotational symmetry when the substrate 20 is rotated once, with an axis passing through a center of the main surface of the GaN substrate 30 and orthogonal to the main surface as the central axis. Depending on a thickness of the GaN film 21 and film-formation conditions, etc., a shape of the honeycomb pattern may be blurred (outline becomes ambiguous) and deformed in some cases. In particular, this tendency becomes stronger in the GaN substrate 30 obtained from a surface side of the GaN film 21, when the plurality of GaN substrates 30 are obtained by slicing the GaN film 21.

Namely, as shown in FIG. 9, the GaN substrate 30 of this embodiment has, on its main surface (namely, a front surface or a back surface), a continuous high dislocation density region 31 and a plurality of low dislocation density regions 32 divided by the region 31. A planar shape of the region 31 is a honeycomb pattern in which outlines of regular hexagonal planar shapes are matched. In FIG. 9, a partial enlarged view of the region 31 is shown (see a balloon portion in the figure). In this partial enlarged view, an example of a state of dislocations appearing on the main surface of the GaN substrate 30, is schematically shown by a solid line and black spots. As is clear from this partial enlarged view, the region having an average dislocation density value (for example, $1 \times 10^7$ numbers/cm$^2$ or more) which is about one digit higher than an average dislocation density value (for example, $5 \times 10^6$ numbers/cm$^2$ or less) in the regions 32, exists as the region 31 along the combined portion between the substrates 10 with a certain degree of width. The abovementioned width as used here is not particularly limited, and is appropriately set depending on a distribution state of the dislocation density in the main surface of the GaN substrate 30. The distribution state of the dislocation density in the region 31 will be described in detail later.

The GaN substrate 30 having such a configuration is obtained by matching the plurality of substrates 10, and therefore it is possible to easily and appropriately respond to a need for a large diameter. Specifically, the substrate 30 can easily and appropriately respond to the need for the large diameter of at least 100 mm or more for example, more specifically an outer diameter of 4 to 6 inches for example.

Further, the GaN substrate 30 has the region 31 on its main surface. An existence of the region 31 can be easily visually confirmed when the region 31 is visible. Further, even when the existence of the region 31 is not visible, its existence can be easily confirmed by an observation using the fluorescence microscope when an impurity concentration (particularly, oxygen concentration) in the region 31 is high. Thus, when the existence of the region 31 can be easily confirmed, it is possible to realize that the region 31 is set as an unusable area, and the regions 32 are selectively used as a usable area for manufacturing a semiconductor device, even in a case of a coexistence of the region 31 and the regions 32. Namely, the semiconductor device can be manufactured by mainly using a region with relatively high strength and quality.

Moreover, when the existence of the region 31 can be easily confirmed, by using a systematic arrangement of the region 31, a direction tendency of the GaN substrate 30 can also be determined. Therefore, for example, by using the region 31, an orientation of the GaN substrate 30 can be judged irrespective of an orientation flat or notch, etc., and the orientation flat and notch, etc., (namely, cut and disposed portion) are not required. Furthermore, due to existence of the region 31 over the entire main surface of the GaN substrate 30, the region 31 can also be used not only for determining the direction tendency of the GaN substrate 30 but also for accurate alignment of the GaN substrate 30. Specifically, for example, it is conceivable to accurately perform a mask alignment for manufacturing a semiconductor device, by using the region 31 as the unusable area.

Further, the region 31 can be confirmed by the observation using the fluorescence microscope when the impurity concentration (particularly, oxygen concentration) in the region 31 is high. The GaN substrate 30 is obtained by slicing the GaN film 21 formed on the substrate 20, as described above (see FIG. 7C for example). In this case, the configuration of existence of the region 31 on the main surface becomes apparent, because an impurity such as oxygen may induce an abnormal discharge, when the electric discharge machining is used at the time of slicing, namely, when the GaN substrate 30 is cut out by electric discharge machining.

As described above, even when the existence of the region 31 is not visible, and further cannot be confirmed by the observation using the fluorescence microscope based on the impurity concentration, its existence can be confirmed by performing the detection using the CL-method for example.

As described above, since each region 32 divided by the region 31 can be used as a region for manufacturing the semiconductor device, each region 32 has an area of at least 1 mm$^2$ or more, preferably 4 mm$^2$ or more, more preferably 100 mm$^2$ or more (for example, 10×10 mm$^2$ or more). The reason is as follows: the area of 4 mm$^2$ or more can respond to a general chip size (for example, about 2 to 3 mm square) of the power device (semiconductor device for an electric power), for example even when the semiconductor device to be manufactured is the power device, and the area of 100 mm$^2$ or more (for example, 10×10 mm$^2$ or more) can sufficiently respond to the chip size of the power device (for example, about 10 mm square) considered to be maximum.

Since each region 32 can be used as the region for manufacturing a semiconductor device, it is preferable that an average dislocation density on a surface of each region 32 is $5 \times 10^6$/cm$^2$ or less, more preferably $1 \times 10^6$/cm$^2$ or less. Further, in each region 32, it is preferable that an average carrier concentration is $1 \times 10^{18}$ cm$^{-3}$ or more, more preferably about $2 \times 10^{18}$ cm$^{-3}$ to $4 \times 10^{18}$ cm$^{-3}$. This is because as long as such a condition is satisfied, each region 32 becomes a significantly high-quality region as a region for manufacturing a semiconductor device. Since a deterioration of a crystallinity may occur when the average carrier concentration exceeds $4 \times 10^{18}$ cm$^{-3}$, it is preferable to set the average carrier concentration within the abovementioned range from this point as well.

Incidentally, the GaN substrate 30 is obtained by combining the plurality of substrates 10, and then growing the GaN film 21. Therefore, the GaN substrate 30 has the region 31 in which a quality, etc., becomes relatively low, under the indirect influence of the combined portion between the substrates 10. As a result, in the region 31, not only the dislocation density but also the impurity concentration may be indirectly influenced by the combined portion. Specifically, it is conceivable that the impurity concentration, particularly the oxygen concentration becomes high in the region 31, under the influence of the combined portion. This means that depending on a state of the combined portion, the impurity concentration, particularly the oxygen concentration of the region 31 can be set to be higher than that of the regions 32. Namely, in the region 31 and the regions 32, there can be a difference in average impurity concentrations (particularly, average oxygen concentrations). When there is the difference in the average impurity concentrations (particularly, the average oxygen concentrations), the existence of the region 31 can be easily confirmed by the observation using the fluorescence microscope as described above. However, there is no necessity for generating the difference in the average impurity concentrations (particularly, the average oxygen concentrations) between the region 31 and the regions 32. Therefore, the region 31 and the regions 32 may be configured so as not to generate the difference between them.

Further, in the region 31, it is conceivable that not only the dislocation density, but also an inclination of a crystal orientation (namely, the off-angles) of the GaN crystals constituting the GaN substrate 30 is indirectly influenced by the combined portion. Specifically, the following influence can be considered.

Each region 32 divided by the region 31 has a crystal orientation distribution in each region. The crystal orientation distribution refers to a distribution of inclinations of the crystal orientations (the off-angles) in the regions 32. However, a specific distribution mode is not particularly limited, and values of the off-angles in the region 32 may be uniform, or may be varied gradually. The off-angle as used herein is defined as an angle formed by a normal line direction of the main surface of the GaN substrate 30 and a main axis direction (a normal line direction of a low index plane closet to a main surface) of the GaN crystals constituting the GaN substrate 30.

In contrast, the region 31 has a dislocation density larger than those of the regions 32. Namely, there are more dislocations in the region 31 than in the regions 32. Therefore, it is conceivable that in the adjacent regions 32 interposing the region 31, a continuity of the crystal orientation distribution (namely, values of the off-angles) is lost and the crystal orientation distribution becomes discontinuous, under an influence of interposing the region 31 between the adjacent regions 32.

On the other hand, even in a case that the adjacent regions 32 interposing the region 31 have a discontinuous distribution of the crystal orientation respectively, a difference in the inclinations of the crystal orientations (the off-angles) between the adjacent regions 32 is within 0.5° for example. The reason is as follows: although the off-angles in each region 32 is influenced by the off-angles in the main surfaces of the plurality of arranged substrates 10, the variation of the off-angles (difference between the maximum value and the minimum value of the off-angles in the entire main surface) of each substrate 10 is suppressed for example within 0.3°, preferably within 0.15°, as described above, and when the difference of the off-angles between the adjacent regions 32 exceeds 0.5°, it may be difficult to configure one GaN substrate 30 by combining the regions 32 even when the region 31 is interposed between the regions 32.

The region 31 and the regions 32 have a continuous smooth surface irrespective of division of the regions. Namely, each surface of the region 31 and the regions 32 has the continuous smooth surface, even when there is a difference in the dislocation density, etc., between the region 31 and the regions 32. This is because the GaN substrate 30 is obtained by slicing the GaN film 21 formed on the substrate 20, as described above.

(Polarity Inversion Domain)

The GaN substrate 30 of this embodiment is a substrate whose main surface does not include the inversion domain as a polarity inversion domain, regardless of the region 31 or the regions 32. The inversion domain refers to a region in which a polarity is reversed from surrounding crystals.

A polarity of GaN will be simply described hereafter. A crystal structure of GaN does not have an inversion symmetry with respect to c-plane. Therefore, GaN has a polarity in the c-axis direction, and +c axis direction and −c axis direction are discriminated, and a plane in the +c axis direction is called a Ga-polar plane or a Ga-plane, and a plane in −c axis direction is called a N-polar plane or a N-plane. In a case of an arrangement of such a crystal structure, one side is the Ga-polar plane, and the opposite side is the N-polar plane. Further, when the N-polar plane is coexisted in the Ga-polar plane for example, the inversion domain is a region where the N-polar plane exists.

In a case of forming a mask made of $SiO_2$ or the like on a GaN thin film, for example as a seed crystal layer when growing the GaN crystals, it can be considered that when nuclei of the GaN crystals are generated on the mask, it is difficult to control the polarities of the GaN crystals formed on the nuclei to be uniform in a certain direction, because the mask does not have polarity. Therefore, in such a case, the inversion domain inevitably occurs from a front surface to a back surface of a substrate constituted by the GaN crystals.

In contrast, in the GaN substrate 30 of this embodiment, the GaN substrate 30 is obtained by arranging the plurality of substrates 10 with reduced the off-angle variation, forming the substrate 20 thereon, forming the GaN film 21 on the substrate 20, and thereafter slicing the GaN film 21. Namely, regarding the GaN crystals constituting the GaN substrate 30, the polarities are controlled to be uniform in the certain direction.

Therefore, the GaN substrate 30 of this embodiment is a substrate whose main surface does not include the inversion domain, namely, a substrate in which the polarities of the GaN crystals constituting the GaN substrate 30 are controlled to be uniform in the certain direction.

When the main surface does not include the inversion domain, the significantly high-quality main surface can be obtained as a region for manufacturing a semiconductor device. This is because, for example, when the inversion domain is included, there is a risk of generating an abnormal growth on a region where the inversion domain exists, but such a risk can be excluded, unless the inversion domain is included.

Existence or nonexistence of such an inversion domain can be judged by determining the polarity of a GaN crystal surface by Convergent Beam Electron Diffraction (CBED) method using a Transmission Electron Microscope (TEM), for example.

(Dislocation Density Distribution State of High Dislocation Density Region)

The GaN substrate 30 of this embodiment has the high dislocation density region 31 which is a finite region. As described above, the region 31 is the region having the larger average dislocation density value than those of the regions 32, and is the region whose existence can be confirmed by performing the detection using the CL-method for example.

A distribution state of the dislocation density in the region 31 will be described in detail hereafter, with a specific example of a detection result obtained by the CL-method. For example, the detection by the CL-method can be performed using a publicly-known CL-strength space mapping drawing device in combination with a Scanning Electron Microscope (SEM).

Figure 13:
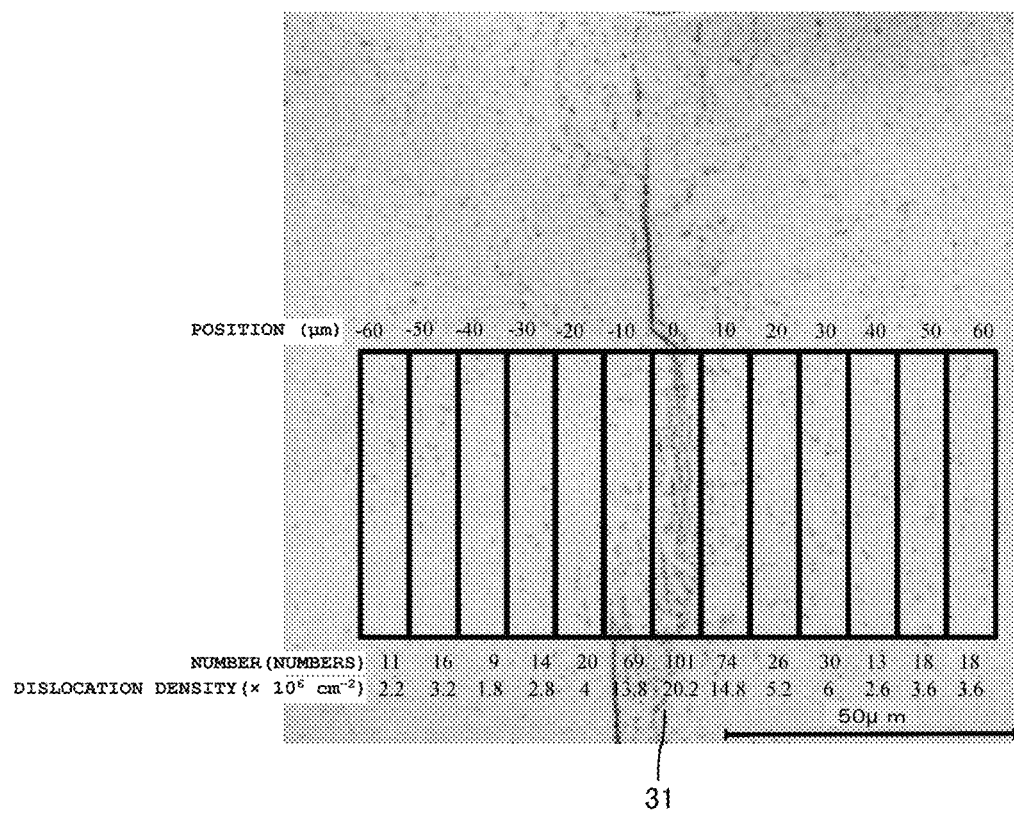
FIG. 13 is an explanation view showing an example of measuring a dislocation density in a high dislocation density region 31 (also referred to as a region 31 hereafter) of the nitride crystal substrate 30 by a CL-method.

The detection of the region 31 by the CL-method was performed as shown in FIG. 13 for example. Specifically, regarding a surface of the GaN substrate 30 including the region 31, a range (a position: ±60 μm) extending to the regions 32 with the region 31 as a center (position: 0 μm), was divided into a plurality of regions of a unit area $S=5\times10^{-6}$ cm$^2$. Then, the number (unit: numbers) of the dislocations existing in each region was counted, and from this counting result, the dislocation density (unit: $\times10^6$ cm$^{-2}$) in each region was calculated. The numbers of the dislocations and the dislocation density in each region are shown in FIG. 13.

Figure 14:
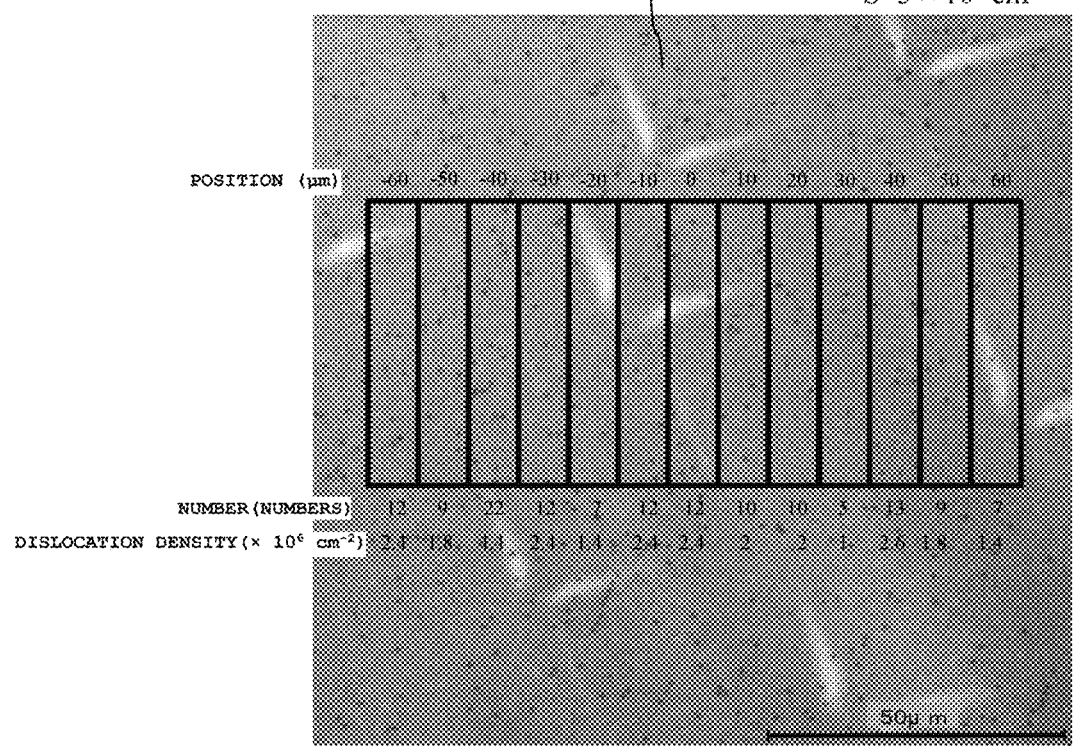
FIG. 14 is an explanation view showing an example of measuring a dislocation density in a low dislocation density region 32 (also referred to as a region 32 hereafter) of the nitride crystal substrate 30 by the CL-method.

Further, for reference, the detection of the region 32 by the CL-method was also performed as shown in FIG. 14 for example. Specifically, regarding on a surface of the GaN substrate 30 not including the region 31, division of the regions was performed in the same manner as in a case of the region 31 as described above. Then, the number (unit: numbers) of the dislocations existing in each region was counted, and from this counting result, the dislocation density (unit: $\times10^6$ cm$^{-2}$) in each region was calculated. The numbers of the dislocations and the dislocation density in each region are shown in FIG. 14.

Figure 15:
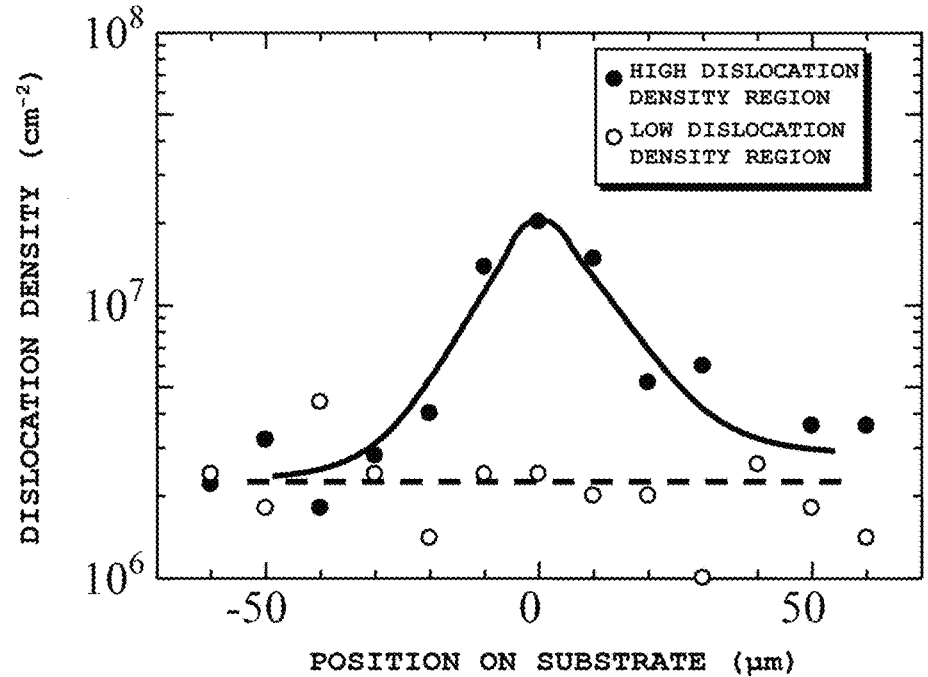
FIG. 15 is an explanation view showing an example of a relation between a position on a substrate and a dislocation density, in each of the region 31 and the region 32.

By combining detection results shown in FIG. 13 and FIG. 14, a distribution state of the dislocation density is obtained as shown in FIG. 15. FIG. 15 shows graphs of plotting the detection results obtained by the CL-method shown in FIG. 13 and FIG. 14, on a coordinate space in which a horizontal axis indicates a position (μm) on a substrate and a vertical axis indicates a dislocation density (cm$^{-2}$).

When fitting is performed to a plot result shown in FIG. 15, it is found that the region 32 shows a distribution state of almost constant (flat) dislocation density values irrespective of the position on the substrate, and meanwhile the region 31 shows a distribution state of the dislocation density values that show a curve in which the value is local maximum (peak) near a central position of the region 31. More specifically, the region 31 shows a distribution state of the dislocation density values which increases monotonically from the region 32 toward the region 31, and decreases monotonically from the region 31 toward the region 32 when the value exceeds a peak near the central position of the region 31.

Namely, the GaN substrate 30 of this embodiment has, on its main surface, the region 31 and the plurality of regions 32 divided by the region 31, and has the distribution state of the dislocation density in which in the region 31, the dislocation density value increases monotonically from one region 32 side toward the peak of the dislocation density value, and the dislocation density value decreases monotonically from the peak to the other region 32 side when the dislocation density value exceeds the peak near the central position of the region 31.

Although the region 31 is the finite region, its outer edge (namely, boundaries with the regions 32) may be specified based on the distribution state in which the dislocation density value increases monotonically or decreases monotonically.

For example, as described above, since the region 32 can be used as a region for manufacturing a semiconductor device, the average dislocation density is preferably $5\times10^6$/cm$^2$ or less, more preferably $1\times10^6$/cm$^2$ or less. A threshold value of the dislocation density for the region which can be the regions 32, is set beforehand based on the average dislocation density, and then a part where the dislocation density value exceeds the threshold value in the distribution state of the dislocation density, is set as the region 31. Thereby the outer edge of the region 31 which is the finite region, can be specified easily and accurately.

The region 32 having such an outer edge exists on the main surface of the GaN substrate 30 with a certain degree of width, and its region width is about 50 μm for example. The method of setting the threshold value of the dislocation density is not limited to the abovementioned method, and it is acceptable to use other method such as using a full width at half maximum of the peak value in the distribution state, for example.

Figure 16:
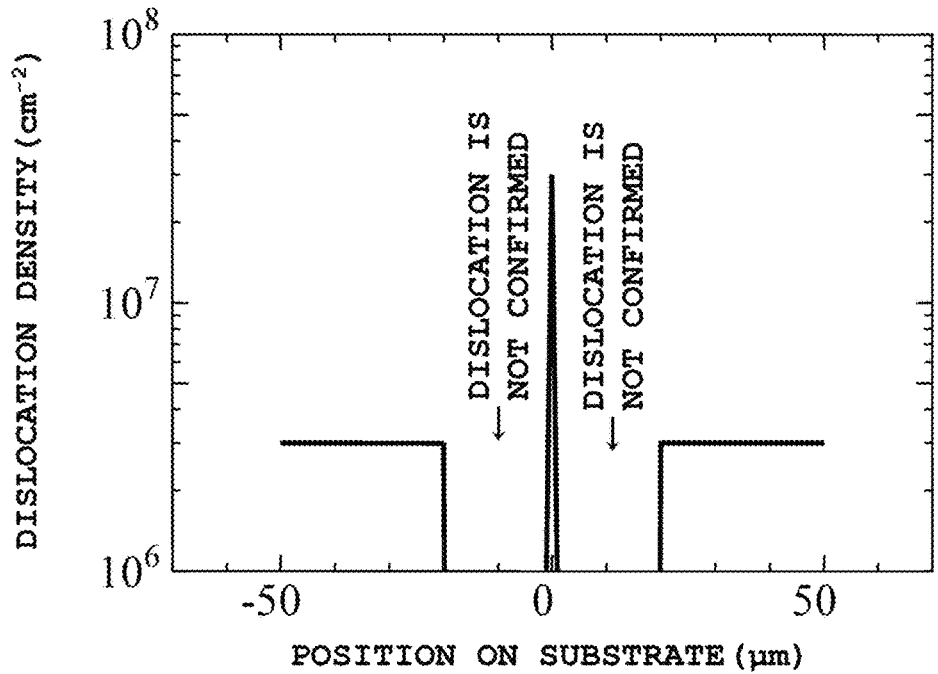
FIG. 16 is an explanation view showing a comparative example of a relation between a position on a substrate and a dislocation density.

In contrast, there is a substrate obtained by arranging a plurality of seed crystal substrates with a certain degree of gap (interspace) therebetween, and combining seed crystal substrates by growing a crystal film on the arranged substrates. There is also a substrate obtained by combining seed crystal substrates after forming a mask at a combined portion between the seed crystal substrates. These substrates do not show the distribution state of the dislocation density values which increase monotonically toward the peak or decreases monotonically from the peak, but show a distribution state of the dislocation density values in which there is a concaved depression where the dislocation is not confirmed before and after the peak as shown in FIG. 16, unlike the GaN substrate 30 of this embodiment, probably due to an influence of Epitaxial Lateral Overgrowth (ELO) or pendeo-epitaxy etc., which is generated at the time of the crystal growth when a gap or mask, etc., exists at the combined portion between the seed crystal substrates.

When a defect density is sharply changed as the substrate having the distribution state having the concave depression in which the dislocation is not confirmed before and after the peak, there is a large strain distribution in a crystal plane. Such a strain distribution may cause a breakage of the substrate in a machining, etc., when manufacturing a semiconductor device, and a problem of remarkably reducing a yield may occur by such a strain distribution.

In this point, according to the GaN substrate 30 of this embodiment, it is conceivable that since the distribution state is a state in which the dislocation density value increases monotonically or decreases monotonically, the defect density gradually and smoothly changes, and therefore the region 31 and each region 32 are combined with each other without having the large strain distribution in the crystal plane. Actually, as described later, when a Raman shift mapping of $E_2$-mode of the GaN crystals is obtained in the vicinity of the combined portion between the region 31 and the region 32 by using Raman Spectroscopy, no change in a shift amount of Raman shift is observed, and it is confirmed that none of each region 31 and region 32 is strained.

(Strain States of High Dislocation Density Region and Low Dislocation Density Region)

In the high dislocation density region 31 and the low dislocation density regions 32 of the GaN substrate 30 of this embodiment, the distribution states of the dislocation densities are different from each other as described above, and meanwhile strain states are substantially the same. The term "strain state" as used herein mainly refers to a strain state of the GaN crystal lattice constituting the GaN substrate 30. When the strain states of the crystal lattices in the region 31 and the region 32 are substantially the same, strain states on the substrate surface configurated by the abovementioned crystal lattice are also substantially the same. The strain state of the crystal lattices can be detected by using Raman spectrometry for example.

The strain states of the region 31 and the regions 32 will be described in detail hereafter, with a specific example of a detection result obtained by using Raman Spectroscopy. A detection of the strain state using Raman Spectroscopy may be performed by a spectrum analysis on Raman scattered light obtained by irradiating the GaN substrate 30 with light having a prescribed wavelength. Such a detection can be performed using a publicly-known microscopic Raman spectroscopic device.

Figure 17:
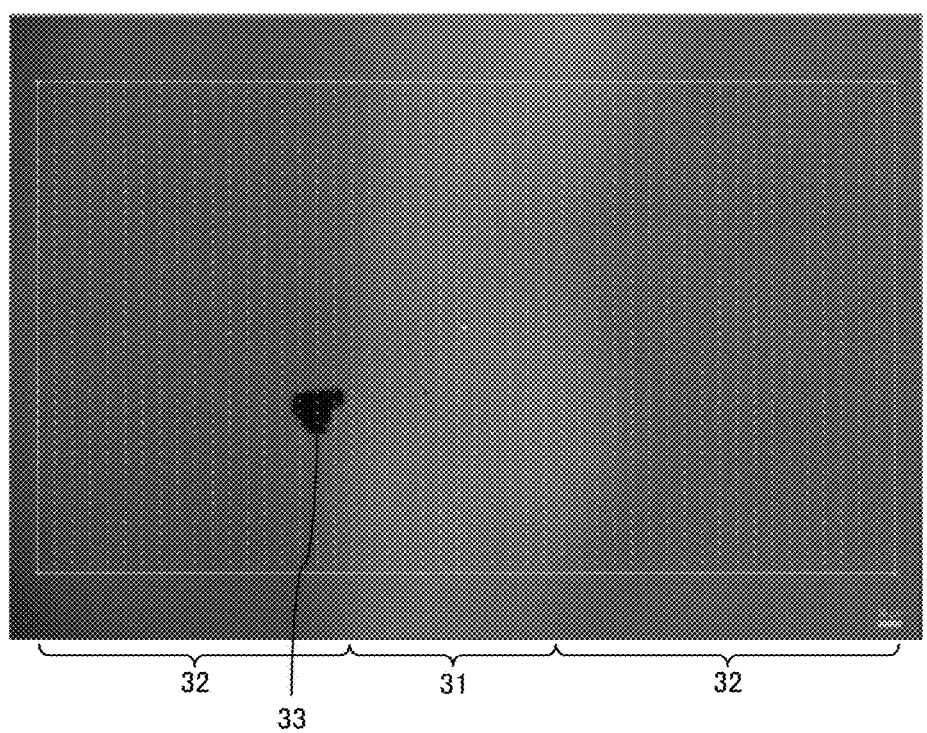
FIG. 17 is an explanation view showing an example of evaluation points in cases that strain states of the region 31 and the region 32 are respectively detected using Raman Spectroscopy.

The detection of the strain states of the region 31 and the regions 32 was performed as shown in FIG. 17 for example. Specifically, a plurality of systematically arranged evaluation points (white points in this figure, for example 50×50 points) were set in each of the region 31 and the regions 32. In this event, in a mapping measurement range (within a white frame in this figure) including each evaluation point, an attached portion of a foreign matter 33 is included for focusing on an optical microscope image obtained by the microscopic Raman spectroscopic device. Then, the strain state is detected at each evaluation point by irradiating each evaluation point with a monochromatic laser beam having a prescribed wavelength (for example, 532 nm) as an excitation light source, detecting Raman scattered light thus obtained, and performing the spectrum analysis on the detection result. So-called Raman spectrum is obtained by this spectrum analysis.

Figure 18:
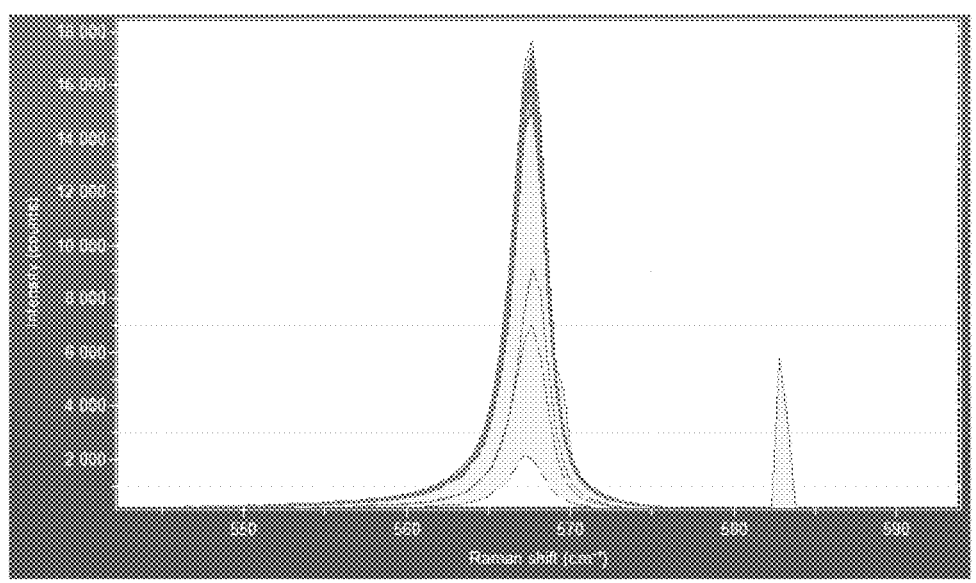
FIG. 18 is an explanation view showing an example of a result of overwriting Raman Spectra obtained at each evaluation point in the region 31 and the region 32.

FIG. 18 shows an example of a result of overwriting Raman spectrums having a shift peak of $E_2$ (high)-mode around 567 cm$^{-1}$ obtained at all evaluation points. According to overwrite result shown here, in each overwritten the Raman spectrum, there is the Raman spectrum in which the shift peak is weak or a slight shift is observed, probably due to an influence of the foreign matters 33, and no change in the shift amount of $E_2$-mode is observed other than the influence of the foreign matters 33. Namely, in both the region 31 and the regions 32, similar Raman spectrums are obtained excluding the attached portion of the foreign matters 33.

Figure 19:
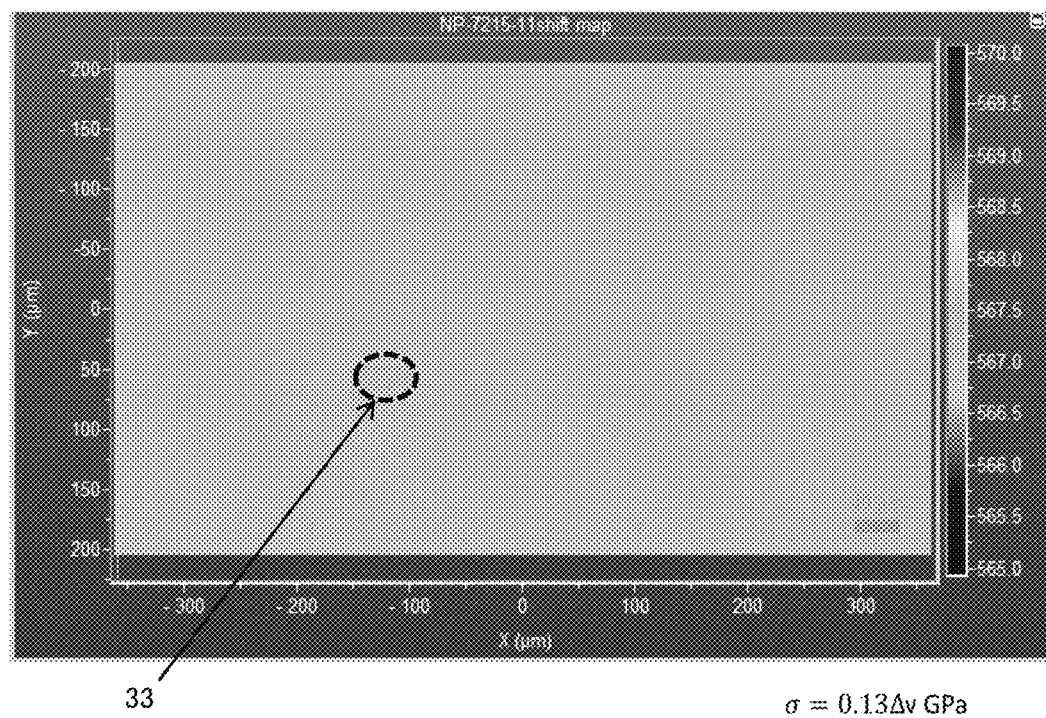
FIG. 19 is an explanation view showing an example of a result of planarly mapping a shift peak of $E_2$-mode obtained at each evaluation point in the region 31 and the region 32.

FIG. 19 shows an example of a result of planarly mapping the shift peak of $E_2$-mode obtained at each evaluation point. A difference in the shift peaks is shown by a difference in display brightness at each evaluation point. According to a mapping result shown here, a slight shift is observed at the attached portion of the foreign matters 33, but the other portions have almost the same display brightness. Namely, in both the region 31 and the regions 32, similar shift peaks are obtained excluding the attached portion of the foreign matters 33.

From these matters, it is found that in the GaN substrate 30 of this embodiment, there is no shift change in the Raman spectrum of the region 31, and there is no strain of the GaN crystal lattice in the region 31. It is also found that the GaN substrate 30 of this embodiment has no strain of the GaN crystal lattice in the regions 32, similarly to the region 31.

Namely, the GaN substrate 30 of this embodiment has a different distribution states of the dislocation densities between the region 31 and the regions 32, but has substantially the same strain states of the GaN crystal lattice, with no strains of the crystal lattice in each region 31 and 32. Here, the term of "substantially the same" includes not only a case that the GaN substrate 30 has a completely matched strain state in each region 31 and 32, but also a case that the GaN substrate 30 has a difference in the strain state between the region 31 and the regions 32, but thereby not causing a problem even if they are regarded as the same within a technical common sense, as long as the attachment of the foreign matters 33, a measurement error, or the like, for example are taken into consideration.

Thus, in a case that the GaN substrate 30 has substantially the same strain state, with no strain of the crystal lattice in each region 31 and 32, the surface of the GaN substrate 30 configurated by this crystal lattice also becomes a state with no strain in each region 31 and 32. Accordingly, the GaN substrate 30 is a substrate with its surface divided into a plurality of the regions 32 by the region 31 which are combined with each other without strain.

In contrast, there is sometimes a possibility of generating the strain of GaN crystal lattice at the combined portion between the seed crystal substrates, in a substrate obtained by arranging a plurality of seed crystal substrates with a certain degree of gap (interspace) therebetween, and combining seed crystal substrates by growing a crystal film on the seed crystal substrates, or in a substrate obtained by combining seed crystal substrates after forming a mask at a combined portion between seed crystal substrates, unlike the GaN substrate 30 of this embodiment, probably due to an influence of ELO or pendeo-epitaxy, etc., which is generated at the time of the crystal growth when the gap or the mask, etc., exists at the combined portion between the seed crystal substrate. Such a partial strain of the crystal lattice may cause a strain of a substrate surface.

In this point, according to the GaN substrate 30 of this embodiment, even in a case of the configuration in which its surface is divided into the regions 32 by the region 31, the substrate as a whole is in the strain-free state due to the strain-free state of each region 31 and 32, and it is significantly suitable for responding to a large-sized substrate, particularly having a diameter of 100 mm or more. As a result, efficiency for manufacturing a semiconductor device is achieved.

(3) Effect Obtained by this Embodiment

According to this embodiment, one or a plurality of effects shown below can be obtained.

(a) When the GaN substrate 30 has, on its main surface, the region 31 and the regions 32, with the main surface not including the inversion domain as the polarity inversion domain, the high-quality GaN substrate 30 can be obtained while responding to the need for the large diameter.

More specifically, it can be said that the fact that the GaN substrate 30 having the region 31 and the regions 32 shows that the GaN substrate 30 is a product obtained as a result of combining the plurality of substrates 10, thereby easily and appropriately responding to the need for the large diameter. Also, by having the region 31 and the regions 32, it is possible to realize that the region 31 is set as the unusable area, and the regions 32 are selectively used as the usable area for manufacturing a semiconductor device. In addition, a risk of generating an abnormal growth can be excluded, unless the inversion domain is included. Therefore, with the above configuration, a significantly high-quality main surface can be obtained as a region for manufacturing a semiconductor device.

(b) When there is the region 31 dividing the regions 32, and further the existence of the region 31 can be easily confirmed, by using the systematic arrangement of the region 31, the direction tendency of the GaN substrate 30 can be determined. Therefore, for example, the orientation of the GaN substrate 30 can be judged irrespective of the orientation flat or notch, etc., and the orientation flat and notch, etc., (namely, cut and disposed portion) are not required. Further, due to existence of the region 31 over the entire main surface of the GaN substrate 30, the region 31 can also be used not only for determining the direction tendency of the GaN substrate 30 but also for accurate alignment of the GaN substrate 30. Specifically, for example, it is conceivable to accurately perform the mask alignment for manufacturing a semiconductor device, by using the region 31 as the unusable area.

(c) When the region 31 is a region in which not only the dislocation density but also the impurity concentration (particularly, oxygen concentration) is high, the configuration of existence of the region 31 on the main surface becomes apparent, by cutting out the GaN substrate 30 by the electric discharge machining. Therefore, an effect obtained by existing the region 31 can be reliably obtained.

(d) When each region 32 has an area of at least 1 mm$^2$ or more, it is preferable as a region for manufacturing a semiconductor device. Further, the area of 4 mm$^2$ or more, more preferably 100 mm$^2$ or more (for example, 10×10 mm$^2$ or more) can sufficiently respond to a chip size (for example, about 2 to 3 mm square, about 10 mm square at a maximum) of the power device (semiconductor device for an electric power), for example even when the semiconductor device to be manufactured is the power device. Therefore, the GaN substrate 30 having the main surface with such a configuration becomes a significantly high-quality substrate as a substrate for manufacturing a semiconductor device.

Figure 10:
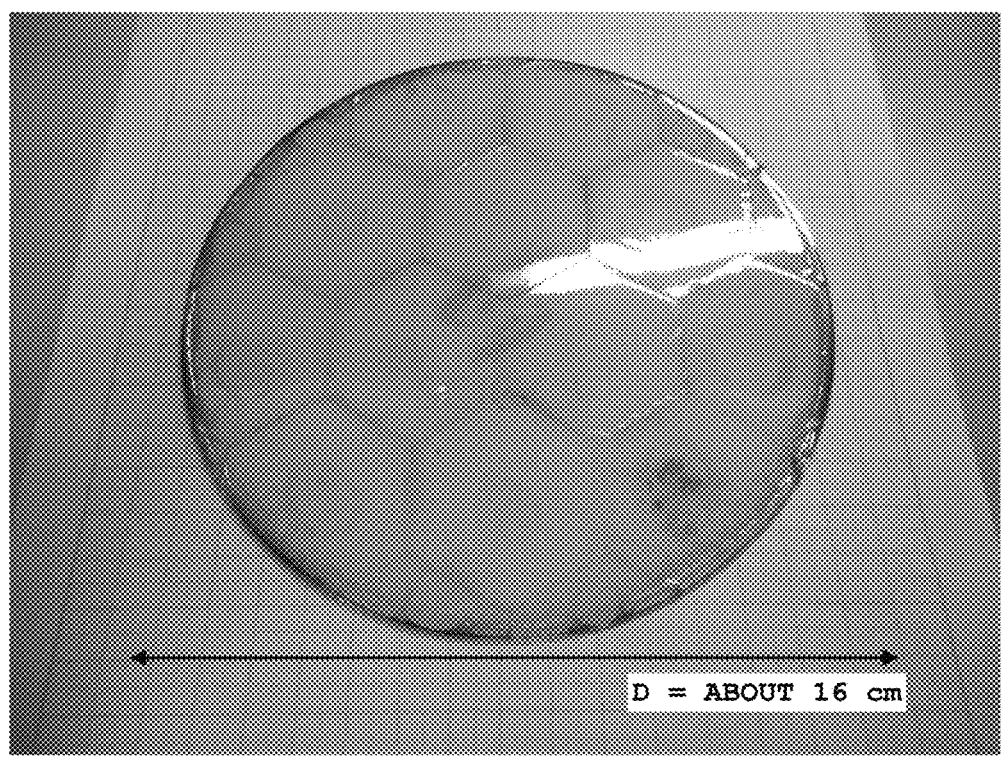
FIG. 10 is a photograph showing a configuration example of a substrate for crystal growth formed by combining a plurality of seed crystal substrates.

(e) In manufacturing the GaN substrate 30, by matching the plurality of relatively small diameter substrates 10, the outer diameter and the shape of the substrate 20 can be arbitrarily changed. In this case, even when the diameter of the substrate 20 is increased, increase of the variation of the off-angles in its main surface can be suppressed. For example, the variation of the off-angles in the main surface of the entire substrate 20 can be equal to or less than the variation of the off-angles in the main surface of each substrate 10. By using such a large diameter substrate 20 with less variation of the off-angles, the high-quality GaN substrate 30 can be manufactured. FIG. 10 is a photograph showing a configuration example of the substrate for crystal growth obtained by matching a plurality of regular hexagonal seed crystal substrates. A diameter of the substrate for crystal growth shown here is about 16 cm, and it is already confirmed that the variation of the off-angles in the main surface of the entire substrate for crystal growth is equal to or less than the variation of the off-angles in the main surface of each seed crystal substrate constituting the substrate for crystal growth. Thus, it can be said that the large diameter substrate for crystal growth with less variation of the off-angles, is the substrate which is difficult to be manufactured without a knowledge as exemplified in this embodiment.

(f) By forming the substrate 10 into a regular hexagonal planar shape, the honeycomb pattern obtained by matching the substrates 10 has two-fold or more rotational symmetry, in this embodiment, six-fold rotational symmetry. Thereby, defects and strains included in the substrate 20, namely, defects and strains caused by being influenced by the combined portion between the adjacent substrates 10 are uniformly distributed over the in-plane area (so as to have six-fold rotational symmetry). As a result, the same effect can be obtained for the GaN substrate 30 prepared using the substrates 10, and such a substrate can be the high-quality substrate in which a warping distribution is uniform over the in-plane area and is not easily cracked.

(g) By forming the substrate 10 into a regular hexagonal planar shape, the plurality of substrates 10 are arranged so as to be mutually engaged in planar view. This makes it possible to suppress the misalignment of the substrates 10 in step 3 and in the subsequent steps. As a result, it is possible to increase the combining strength between the substrates 10 and improve the quality of the GaN films 14 and 21 grown thereon.

(h) By forming all lateral surfaces of the substrates 10 opposed to the lateral surfaces of other substrates 10, as the M-planes or a-planes and as the planes having the same orientation with each other, it is possible to increase the combining strength when the adjacent substrates 10 are combined in step 3 (crystal growth step). For example, by combining the substrates 10 with each other by the M-planes or the a-planes, particularly by the a-planes, it is possible to increase the combining strength between the substrates 10, compared with the case in which they are combined with each other by planes excluding "the M-plane or the a-plane".

(i) When the substrate 10 is obtained from the substrate 5, it is possible to cleave the substrate 5 with good controllability by previously forming the recessed grooves on the back surface of the substrate 5. This makes it possible to cleave the lateral surface of the substrate 10 by the a-plane (namely, plane difficult to be cleaved), even when the lateral surfaces of the substrates 10 are combined by the a-planes for example.

(j) The crystal growth of the GaN film 14 is carried out in a state in which the plurality of substrates 10 are adhered onto the holding plate 12 (a state in which the adhesive agent 11 is solidified). Therefore, it is possible to suppress the misalignment of the substrates 10 in this process, increase the combining strength between the substrates 10, and improve the quality of crystals grown thereon. In addition, compared with a case where the substrate 10 is fixed on the holding plate 12 by fixing the substrate 10 from the outer periphery with a jig without using the adhesive agent 11, it is possible to increase the combining strength between the substrates 10 and improve the quality of the crystal to be grown thereon. This is because when the jig is used, a pressure is applied to the arranged substrates 10 along its arrangement direction at least at a room temperature. Then, at the film-formation temperature, the pressure increases due to the influence of thermal expansion, and therefore, the arrangement of the substrate 10 collapses, the main surface cannot exist on the same plane, chipping and cracks occur in the substrate 10, and further, particles generated at that time get on the main surface, in some cases. By adhering the substrates 10 using the adhesive agent 11, it is possible to avoid these problems.

(k) Since the crystal growth is carried out in a state in which the plurality of substrates 10 are adhered onto the holding plate 12 (a state in which the adhesive agent 11 is solidified), crystals growing on each substrate 10 interact to generate stress applied to the substrates 10. Even in such a case, the misalignment of the substrates 10 or the like can be avoided. As the crystal growth proceeds, interaction acts so that the growth surface of the crystal growing on each substrate 10 becomes a continuous surface, namely, so as to make the substrate 10 inclined or raised. However, by carrying out the crystal growth in a state in which the adhesive agent 11 is solidified as described in this embodiment, it is possible to avoid the inclination and rise of the substrates 10 in the process. As a result, it is possible to suppress the warping of the finally obtained substrate 20, and avoid an increase in variation of the off-angles on the entire main surface of the substrate 20.

(l) By using the material such as isotropic graphite or pyrolytic graphite as the material of the holding plate 12, the substrate 20 can be easily freestanding from the holding plate 12. In particular, by using the pyrolytic graphite or the abovementioned composite material as the material of the holding plate 12, it is possible to cause the surface layer of the holding plate 12 to act as the sacrificial layer 12a, and it becomes possible to more easily make the substrate 20 in a freestanding state.

Figure 12A:
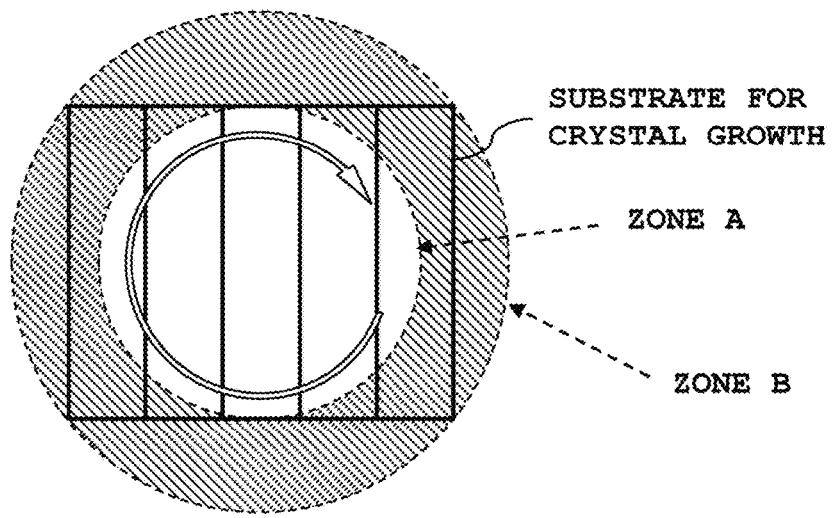
FIG. 12A and FIG. 12B are pattern diagrams showing comparative examples of substrates for crystal growth, respectively.
Figure 12B:
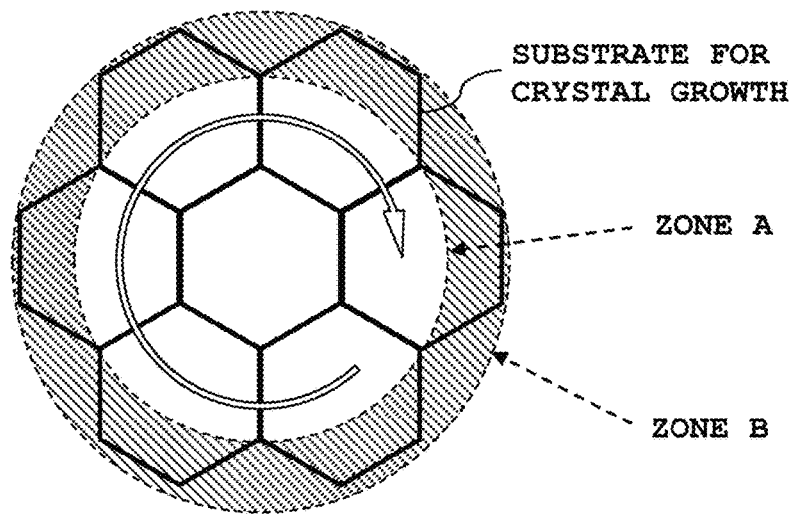

(m) By forming the substrate 20 into a disc shape, it is possible to improve the in-plane uniformity of the crystal grown on the substrate 20. This is because when the vapor phase growth is carried out by rotating the substrate 20 in the HVPE apparatus 200 as described in this embodiment, it is possible to make conditions uniform for supplying a raw material gas, etc., in the in-plane area of the substrate 20 by forming the substrate 20 into a disc shape. In contrast, in a case of using a rectangular substrate for crystal growth formed by combining reed-shaped seed crystal substrates as shown in FIG. 12A, or in a case of using a honeycomb-shaped substrate for crystal growth formed by combining hexagonal seed crystal substrates having the same size and the same shape as shown in FIG. 12B, difference is more likely to occur in various conditions such as supply amounts and consumption amounts of the raw material gas, and temperature, between an inner peripheral side (zone A) and an outer peripheral side (zone B) of the substrate for crystal growth. Therefore, in these cases, it is difficult to enhance the in-plane uniformity of the crystal as described in this embodiment.

(n) When the region 31 has the distribution state of the dislocation density, which is the state that the dislocation density value increases monotonically toward the peak or decreases monotonically from the peak, the outer edge of the region 31 can be easily and accurately specified. Further, according to this embodiment, the yield when manufacturing a semiconductor device can be improved, because there is no influence of ELO or pendeo-epitaxy, etc., which is generated at the time of the crystal growth, and there is no large strain distribution in the crystal plane, unlike a substrate obtained by arranging a plurality of seed crystal substrates with a certain degree of gaps (interspaces), combining the seed crystal substrates by growing a crystal film on the seed crystal substrates, or a substrate obtained by combining the seed crystal substrates after forming a mask at a combined portion between seed crystal substrates.

(o) In the GaN substrate 30 having the configuration in which the region 31 divides the region 32, even in a case that the distribution states of the dislocation density are different between the region 31 and the region 32, the entire substrate 30 becomes a state in which there is no strain, as long as the strain states in the region 31 and the regions 32 are substantially the same, and both the region 31 and the regions 32 are states in which there are no strains. As a result, the GaN substrate 30 is significantly suitable in responding to the substrate with the large diameter of particularly 100 mm or more, thereby the semiconductor device can be manufactured efficiently.

Other Embodiment

As described above, embodiments of the present disclosure have been described specifically. However, the present disclosure is not limited to the abovementioned embodiments, and can be variously modified in a range not departing from the gist of the disclosure.

(a) In the abovementioned embodiment, explanation has been given for a case in which when the substrate 20 is rotated once, with an axis passing through the center of the main surface of the substrate 20 and orthogonal to the main surface as a central axis, the honeycomb pattern obtained by matching the substrates 10 has six-fold rotational symmetry. However, the present disclosure is not limited thereto.

Figure 3A:
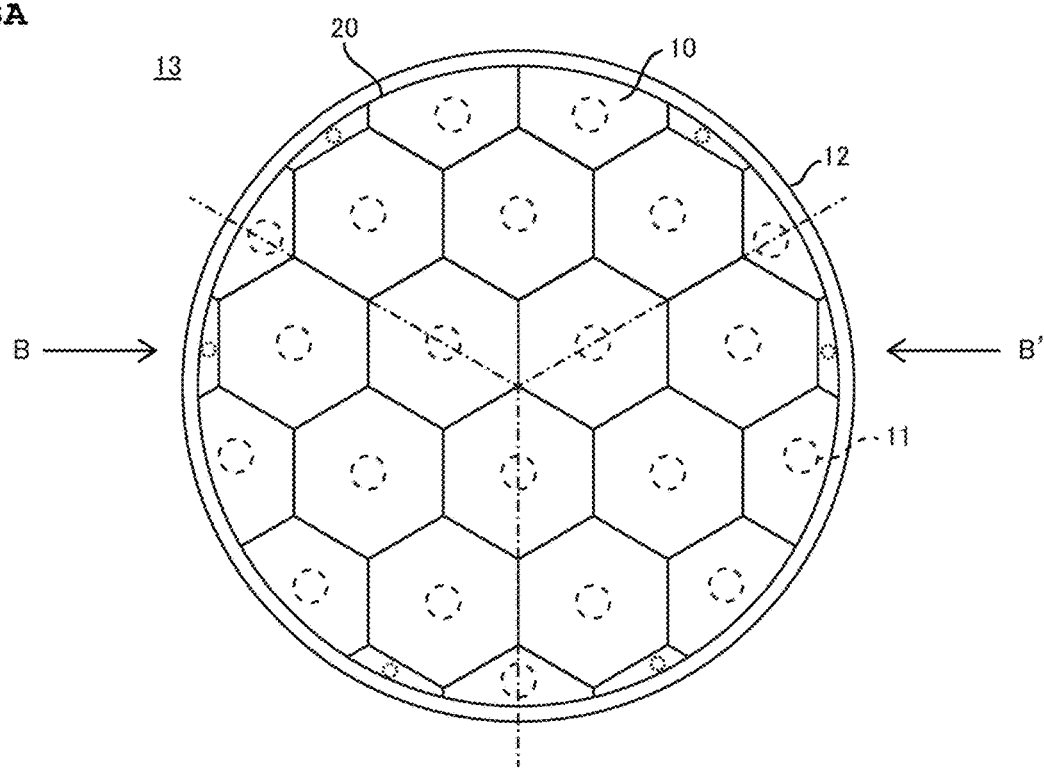
FIG. 3A is a planar view showing a modified example of the assembled substrate 13 formed by adhering the plurality of seed crystal substrates 10 onto the holding plate 12.
Figure 3B:
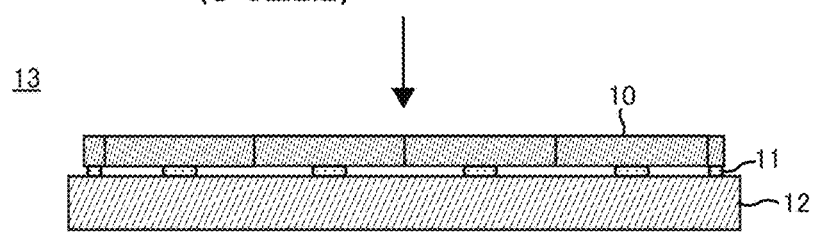
FIG. 3B is a cross-sectional view taken along a line B-B' of the assembled substrate 13 shown in FIG. 3A.

For example, as shown in FIG. 3A, even when the honeycomb pattern obtained by matching the substrates 10 has three-fold rotational symmetry, the same effect as the abovementioned embodiment can be obtained. However, the arrangement shown in FIG. 2A is more preferable than the arrangement shown in FIG. 3A in the point that defects and strains included in the substrate 20 can be more uniformly dispersed over the entire in-plane area. As a result, the same effect can be obtained regarding the finally obtained GaN substrate 30 as well, and this arrangement is preferable in the point that the warping distribution is more uniform over the in-plane area, thus making it possible to make this substrate a high-quality substrate which is hardly cracked.

Further, for example, as shown in FIG. 4A, even when the honeycomb pattern obtained by matching the substrates 10 has two-fold rotational symmetry (namely, line symmetry), the same effect as the abovementioned embodiment can be obtained. However, the arrangements shown in FIG. 2A and FIG. 3A are more preferable than the arrangement shown in FIG. 4A in the point that the defects and strains included in the substrate 20 can be more uniformly dispersed over the in-plane area. As a result, the same effect can be obtained regarding the finally obtained GaN substrate 30 as well, and this arrangement is preferable in the point that the warping distribution is more uniform over the in-plane area, thus making it possible to make this substrate a high-quality substrate which is hardly cracked.

(b) In the abovementioned embodiment, explanation has been given for a case in which all lateral surfaces of the substrates 10 opposed to the lateral surfaces of other substrates 10 are a-planes. However, the present disclosure is not limited thereto, and the substrates 10 may be combined by the planes excluding a-planes.

(c) All lateral surfaces of the substrates 10 opposed to the lateral surfaces of other substrates 10 may be M-planes. Since the M-plane is the plane which is easy to cleave, the substrate 10 can be efficiently manufactured from the substrate 5 at a low cost.

In this case, when the plurality of substrates 5 are prepared, it is preferable that variations of the off-angles (difference between a maximum value and a minimum value of the off-angles) in the main surface of each substrate 5 are less than 0.10, and variations of the off-angles (difference between a maximum value and a minimum value of the off-angles) among the plurality of substrates 5 are less than 0.10. This makes it possible to sufficiently increase the combining strength between the adjacent substrates 10.

Further, in this case, it is also possible to increase the combining strength between the adjacent substrates 10 by making the thicknesses of the adjacent substrates 10 different from each other and providing a gap in the heights of these main surfaces. This is because by providing the gap in the heights of the main surfaces, it is possible to disturb a gas flow in the vicinity of the combined portion between the adjacent substrates 10 (causing the gas to stay in the vicinity of the combined portion), thereby making it possible to promote the crystal growth locally in the vicinity of the combined portion. Further, by providing the gap in the heights of the main surfaces, it is possible to appropriately control a direction of a gas flow flowing in the vicinity of the combined portion or the like, thereby making it possible to promote crystal growth toward the creeping direction.

(d) In the abovementioned embodiment, explanation has been given for a case in which the holding plate 12 and the substrates 10 are made of different materials, and they are adhered to each other by using the adhesive agent 11. However, the present disclosure is not limited thereto. For example, a substrate made of GaN polycrystal (GaN polycrystalline substrate) may be used as the holding plate 12, and the holding plate 12 and the substrates 10 may be directly combined without interposing the adhesive agent 11 therebetween. For example, by plasma-treating the surface of the holding plate 12 made of GaN polycrystal, the main surface thereof is terminated with OH-groups, and thereafter, the substrate 10 is directly placed on a main surface of the holding plate 12, thus making it possible to integrally combine them. Then, moisture or the like remaining between the holding plate 12 and the substrate 10 can be removed by annealing a laminated body formed by combining the holding plate 12 and the substrate 10, and the laminated body can be suitably used as the abovementioned assembled substrate 13 or the substrate 20.

(e) In the abovementioned embodiment, explanation has been given for a case in which the hydride vapor phase epitaxy method (HVPE method) is used as the crystal growth method in steps 3 and 5, but the present disclosure is not limited thereto. For example, in any one or both of steps 3 and 5, a crystal growth method excluding HVPE method, such as metal organic chemical vapor deposition method (MOCVD method) may be used. Even in this case, the same effect as the abovementioned embodiment can be obtained.

Figure 8A:
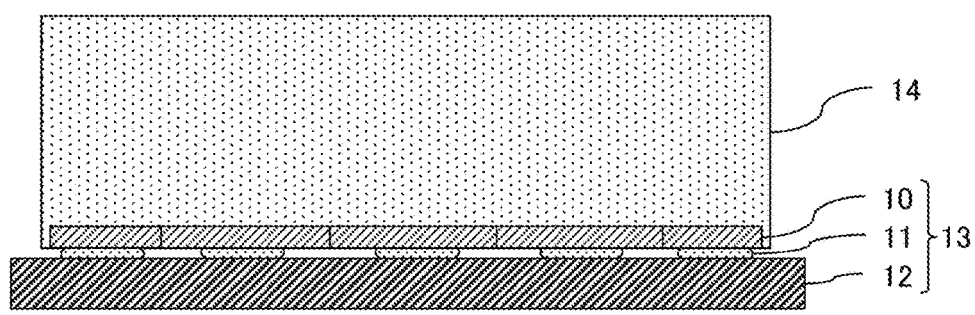
FIG. 8A is a cross-sectional configuration view showing a state of making the crystal film 14 grow thick on the seed crystal substrates 10.
Figure 8B:
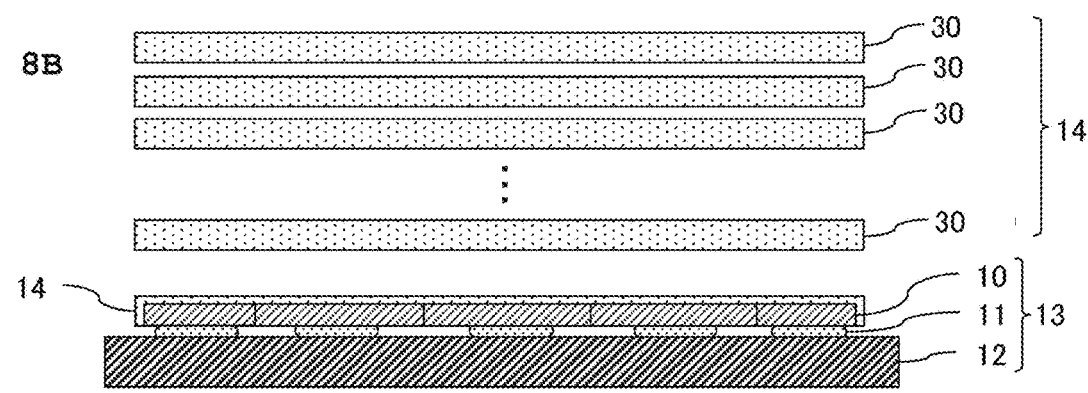
FIG. 8B is a pattern diagram showing a state of obtaining the plurality of nitride crystal substrates 30 by slicing the thickly grown crystal film 14.

(f) In the abovementioned embodiment, explanation has been given for a case in which the GaN substrate 30 is manufactured by preparing the freestanding substrate 20 by peeling it from the holding plate 12 and growing the GaN film 21 thereon. However, the present disclosure is not limited thereto. Namely, after the assembled substrate 13 is prepared, the GaN film 14 is thickly grown on the substrate 10 as shown in FIG. 8A, and then the GaN film 14 is sliced as shown in FIG. 8B so that one or more GaN substrates 30 may be obtained. In other words, from the preparation of the assembled substrate 13 to the manufacture of the GaN substrate 30 may be performed consistently without going through the step of making the freestanding state of the substrate 20. In this case, unlike the abovementioned embodiment, heating of the substrate 10 is performed through the holding plate 12 and the adhesive agent 11, so the heating efficiency may be reduced in some cases. However, in other respects, substantially the same effect as the abovementioned embodiment can be obtained. In this case, a vapor phase growth step in step 3 may be abbreviated. Further, each of steps 3 and 5 may be performed without abbreviating by making the growth condition in these steps 3 and 5 different from each other.

(g) In the abovementioned embodiment, explanation has been given for a case in which the adjacent substrates 10 are combined with each other and used as the substrate 20, namely, the case in which the substrate 20 includes the substrates 10. However, the present disclosure is not limited thereto. Namely, each of one or more substrates obtained by slicing the GaN film 14 grown thick as described above may be used as the substrate 20. Even in this case, the same effect as the abovementioned embodiment can be obtained.

The substrate 20 thus obtained does not include the substrates 10 in its configuration unlike the abovementioned embodiment, but similarly to the GaN substrate 30, the substrate 20 sometimes has a high dislocation density region in which a dislocation density is relatively increased, namely, a region in which a strength is relatively decreased or a quality is relatively deteriorated under an indirect influence of the combined portion between the substrates 10. When the main surface of the substrate 10 is a regular hexagon, as shown by shading in FIG. 9, the high defect region configurates the honeycomb pattern which has six-fold rotational symmetry. This point is as described above.

(h) The present disclosure is not limited to GaN, and can also be suitably applied when manufacturing a substrate made of a nitride crystal such as aluminum nitride (AlN), aluminum gallium nitride (AlGaN), indium nitride (InN), indium gallium nitride (InGaN), aluminum indium gallium nitride (AlInGaN), namely, group III nitride crystal represented by a composition formula of $Al_xIn_yGa_{1-x-y}N$ ($0 \leq x+y \leq 1$).

Preferable Aspects of the Present Disclosure

Preferable aspects of the present disclosure will be supplementarily described hereafter.
(Supplementary Description 1)
According to an aspect of the present disclosure, there is provided a nitride crystal substrate made of a nitride crystal with a diameter of 100 mm or more, having on its main surface: a continuous high dislocation density region and a plurality of low dislocation density regions divided by the high dislocation density region, with the main surface not including a polarity inversion domain.
(Supplementary Description 2)
There is provided the substrate of the supplementary description 1, wherein the plurality of low dislocation density regions have an area of at least 1 $mm^2$ or more, respectively.
(Supplementary Description 3)
There is provided the substrate of the supplementary description 2, wherein the plurality of low dislocation density regions have an area of 100 $mm^2$ or more, respectively.
(Supplementary Description 4)
There is provided the substrate of any one of the supplementary descriptions 1 to 3, wherein a planar pattern of the high dislocation density region is a honeycomb pattern in which outlines of regular hexagonal planar shapes are matched.
(Supplementary Description 5)
There is provided the substrate of any one of the supplementary descriptions 1 to 4, wherein in the plurality of low dislocation density regions, an average dislocation density is $5 \times 10^6$ numbers/$cm^2$ or less, respectively.
(Supplementary Description 6)
There is provided the substrate of any one of the supplementary descriptions 1 to 5, wherein in the plurality of low dislocation density regions, an average carrier concentration is $1 \times 10^{18}$ $cm^{-3}$ or more, respectively.
(Supplementary Description 7)
There is provided the substrate of any one of the supplementary descriptions 1 to 6,
wherein the plurality of low dislocation density regions have a crystal orientation distribution in each region; and
in the adjacent low dislocation density regions interposing the high dislocation density region, the crystal orientation distribution is discontinuous.

(Supplementary Description 8)

There is provided the substrate of the supplementary description 7, wherein in the low dislocation density regions, a difference in inclinations of crystal orientations is within 0.5°.

(Supplementary Description 9)

There is provided the substrate of any one of the supplementary descriptions 1 to 8, wherein the high dislocation density region and the low dislocation density regions have a continuous smooth surface irrespective of division of the regions.

(Supplementary Description 10)

There is provided the substrate of any one of the supplementary descriptions 1 to 9, wherein in the high dislocation density region and the low dislocation density regions, there is a difference in average impurity concentrations.

(Supplementary Description 11)

There is provided the substrate of any one of the supplementary descriptions 1 to 10, wherein the high dislocation density region has a distribution state of a dislocation density, which is a state that a dislocation density value increases monotonically toward a peak value or decreases monotonically from a peak value.

(Supplementary Description 12)

There is provided the substrate of the supplementary description 11, wherein in the high dislocation density region and the low dislocation density regions, strain states are substantially the same.

(Supplementary Description 13)

There is provided the substrate of the supplementary description 12, wherein the strain state is a state specified from a detection result obtained by using Raman Spectroscopy.

(Supplementary Description 14)

There is provided a substrate for crystal growth with a base surface for growing a nitride crystal, having a plurality of seed crystal substrates made of a nitride crystal, and arranged in a planar appearance so that their main surfaces are parallel to each other and lateral surfaces are opposed to each other, wherein at least one of the plurality of seed crystal substrates constituting a portion excluding a peripheral portion has a main surface formed into a regular hexagonal planar shape; and a honeycomb pattern obtained by matching the seed crystal substrates has three-fold or more symmetry, when the substrate for crystal growth is rotated once, with an axis passing through a center of a main surface of the substrates for crystal growth and orthogonal to the main surface as a central axis.

(Supplementary Description 15)

There is provided the substrate of the supplementary description 14, wherein the honeycomb pattern has a six-fold symmetry, when the substrate for crystal growth is rotated once with the axis as a central axis.

(Supplementary Description 16)

There is provided the substrate of the supplementary description 14 or 15, wherein all lateral surfaces of the seed crystal substrate opposed to lateral surfaces of the other seed crystal substrates are M-planes, and are planes in the same orientation with each other (equivalent planes).

(Supplementary Description 17)

There is provided the substrate of the supplementary description 14 or 15, wherein all lateral surfaces of the seed crystal substrate opposed to lateral surfaces of the other seed crystal substrates are a-planes, and are planes in the same orientation with each other (equivalent planes).

(Supplementary Description 18)

There is provided the substrate of any one of the supplementary descriptions 14 to 17, wherein the seed crystal substrate is formed by applying processing to a crystal substrate having a larger outer diameter than the seed crystal substrate (by removing a peripheral portion of the crystal substrate);

the lateral surfaces of the seed crystal substrate has a melted plane (laser machined plane) or a cut plane (mechanically machined plane) generated when forming a recessed groove on a back surface of the crystal substrate, and a cleavage plane generated when the crystal substrate is cleaved along the recessed groove; and the plurality of seed crystal substrates are arranged so that at least the cleavage planes of the lateral surfaces thereof are opposed to each other.

(Supplementary Description 19)

There is provided a substrate for crystal growth having a crystal film grown on a seed crystal substrate, wherein the crystal film has a high dislocation density region (high defect region) with a dislocation density (or defect density) larger than an average dislocation density (or average defect density) in the crystal film;

a planar pattern of the high dislocation density region is a honeycomb pattern in which outlines of regular hexagonal planar shapes are matched; and the honeycomb pattern has a three-fold or more symmetry when the substrate for crystal growth is rotated once, with an axis passing through a center of a main surface of the substrate for crystal growth and orthogonal to the main surface as a central axis.

Preferably, there is provided a substrate for crystal growth with a base surface for growing a nitride crystal, having a crystal film grown on a plurality of seed crystal substrates made of the nitride crystal, and arranged in a planar appearance so that their main surfaces are parallel to each other and lateral surfaces are opposed to each other, wherein the crystal film has a high dislocation density region (high defect region) with a dislocation density (or defect density) larger than an average dislocation density (or average defect density) in the crystal film, under an influence of a combined portion between the seed crystal substrates;

a planar pattern of the high dislocation density region is a honeycomb pattern by having a regular hexagonal planar shape in the shape of main surface of at least one of the plurality of seed crystal substrates constituting a portion excluding a peripheral portion; and the honeycomb pattern has three-fold or more symmetry when the substrate for crystal growth is rotated once, with an axis passing through a center of a main surface of the substrate for crystal growth and orthogonal to the main surface as a central axis.

(Supplementary Description 20)

There is provided a nitride crystal substrate, having a crystal film grown on a substrate for crystal growth, wherein the crystal film has a high dislocation density region (high defect region) with a dislocation density (or defect density) larger than an average dislocation density (or average defect density) in the crystal film;

a planar shape of the high dislocation density region is a honeycomb pattern in which outlines of regular hexagonal planar shapes are matched; and the honeycomb pattern has a three-fold or more symmetry when the nitride crystal substrate is rotated once, with an axis passing through a center of a main surface of the nitride crystal substrate and orthogonal to the main surface as a central axis.

Preferably, there is provided a nitride crystal substrate, having a crystal film grown on a substrate for crystal growth of any one of the supplementary descriptions 14 to 19, wherein the crystal film has a high dislocation density region (high defect region) with a dislocation density (or defect density) larger than an average dislocation density (or average defect density) in the crystal film, under an influence of a combined portion between the seed crystal substrates;
a planar pattern of the high dislocation density region is a honeycomb pattern by having a regular hexagonal planar shape in the shape of main surface of at least one of the plurality of seed crystal substrates constituting a portion excluding a peripheral portion; and
the honeycomb pattern has a three-fold or more symmetry when the nitride crystal substrate is rotated once, with an axis passing through a center of a main surface of the nitride crystal substrate and orthogonal to the main surface as a central axis.

(Supplementary Description 21)

There is provided a method for manufacturing a nitride crystal substrate, including:
(a) arranging a plurality of seed crystal substrates made of a nitride crystal in a planar appearance so that their main surfaces are parallel to each other and lateral surfaces are opposed to each other, to prepare a substrate for crystal growth having a base substrate for crystal growth;
(b) growing a crystal film on the substrate for crystal growth; and
(c) slicing the crystal film grown on the substrate for crystal growth, to obtain a nitride crystal substrate,
wherein in (a), a substrate having a main surface formed into a regular hexagonal planar shape and having an area of at least 1 mm$^2$ or more is used as at least one of the plurality of seed crystal substrates constituting a portion excluding a peripheral portion; and
a honeycomb pattern obtained by matching the seed crystal substrates is formed into a shape having a three-fold or more symmetry when the substrate for crystal growth is rotated once with an axis passing through a main surface of the substrate for crystal growth and orthogonal to the main surface as a central axis, and
wherein in (c), the nitride crystal substrate is obtained, which is constituted so that the nitride crystal substrate has, on its main surface, a continuous high dislocation density region and a plurality of low dislocation density regions divided by the high dislocation density region, with the main surface not including a polarity inversion domain.

Preferably, there is provided a method for manufacturing a nitride crystal substrate, including:
(d) arranging a plurality of seed crystal substrates made of nitride crystals in a planar appearance so that their main surfaces are parallel to each other and lateral surfaces are opposed to each other, to manufacture a substrate for crystal growth,
wherein in (d), a substrate having a main surface formed into a regular hexagonal planar shape is used as at least one of the plurality of seed crystal substrates constituting a portion excluding a peripheral portion; and
a honeycomb pattern formed by combined portions between the seed crystal substrates is a shape having a three-fold or more symmetry when the substrate for crystal growth is rotated once with an axis passing through a center of a main surface of the substrate for crystal growth and orthogonal to the main surface as a central axis.

(Supplementary Description 22)

There is provided a method for manufacturing a substrate for crystal growth, including:
(e) preparing an assembled substrate formed by adhering a plurality of seed crystal substrates onto a holding plate through an adhesive agent;
(f) heating the assembled substrate, to grow a crystal film on the seed crystal substrates; and
(g) making a freestanding state of a substrate for crystal growth formed by combining the adjacent seed crystal substrates by the crystal film,
wherein in (g), the substrate for crystal growth and the holding plate are separated from each other by peeling (only) a surface layer of the holding plate.

(Supplementary Description 23)

There is provided the method of the supplementary description 22, wherein a material having a linear expansion coefficient equal to or smaller than a linear expansion coefficient of a crystal constituting the seed crystal substrate is used as a material of the holding plate.

(Supplementary Description 24)

There is provided the method of the supplementary description 22 or 23, wherein a material having a linear expansion coefficient equal to or smaller than a linear expansion coefficient of a crystal constituting the crystal film is used as a material of the holding plate.

(Supplementary Description 25)

There is provided the method of any one of the supplementary descriptions 22 to 24, wherein a material having a linear expansion coefficient close to the linear expansion coefficient of the crystal constituting the seed crystal substrate is used as a material of the adhesive agent.

(Supplementary Description 26)

There is provided the method of any one of the supplementary descriptions 22 to 25, wherein a material having a linear expansion coefficient close to the linear expansion coefficient of the crystal constituting the crystal film is used as a material of the adhesive agent.

(Supplementary Description 27)

There is provided the method of any one of the supplementary descriptions 22 to 26,
wherein any one of an isotropic graphite, an anisotropic graphite, or a composite material obtained by coating a surface of a flat base plate made of an isotropic graphite with an anisotropic graphite, is used as a material of the holding plate, and
a material mainly composed of zirconia or silica is used as a material of the adhesive agent.

(Supplementary Description 28)

There is provided the method of any one of the supplementary descriptions 22 to 27, wherein the adhesive agent is applied only to a region excluding a peripheral portion (preferably, a central portion) of a back surface of the seed crystal substrate (, to prevent the adhesive agent from wrapping around toward a main surface of the seed crystal substrate).

(Supplementary Description 29)

There is provided the method of any one of the supplementary descriptions 22 to 28, wherein a member having a recessed groove along a combined portion between the adjacent seed crystal substrates, is used as the holding plate, for escaping an excessive adhesive agent (, to prevent the adhesive agent from wrapping around toward a main surface of the seed crystal substrate) when the seed crystal substrate is adhered onto a main surface of the holding plate.

DESCRIPTION OF SIGNS AND NUMERALS

10 Seed crystal substrate
20 Substrate for crystal growth
30 GaN substrate (nitride crystal substrate)
31 High dislocation density region
32 Low dislocation density region

What is claimed is:

1. A nitride crystal substrate made of a nitride crystal with a diameter of 100 mm or more, having on its main surface:
    a continuous first region having a first dislocation density, and a plurality of second regions which are divided by the first region and which have a second dislocation density lower than the first dislocation density, with the main surface not including a polarity inversion domain,
    wherein the first region has a distribution state of a dislocation density, which is a state that a dislocation density value increases monotonically toward a peak value or decreases monotonically from a peak value.

2. The nitride crystal substrate according to claim 1, wherein each of the second regions has an area of at least 1 mm² or more.

3. The nitride crystal substrate according to claim 1, wherein a planar pattern of the first region is a honeycomb pattern in which outlines of regular hexagonal planar shapes are matched.

4. The nitride crystal substrate according to claim 1, wherein in each of the second regions, an average dislocation density is $5 \times 10^6$ numbers/cm² or less.

5. The nitride crystal substrate according to claim 1, wherein in each of the second regions, an average carrier concentration is $1 \times 10^{18}$ cm$^{-3}$ or more.

6. The nitride crystal substrate according to claim 1, wherein an average impurity concentration in the first region differs from an average impurity concentration in the second regions.

7. The nitride crystal substrate according to claim 1, wherein in the first region and the second regions, strain states are substantially the same.

8. The nitride crystal substrate according to claim 7, wherein the strain state is a state specified from a detection result obtained by using Raman Spectroscopy.

* * * * *

UNITED STATES PATENT AND TRADEMARK OFFICE
CERTIFICATE OF CORRECTION

PATENT NO. : 10,584,031 B2
APPLICATION NO. : 16/082598
DATED : March 10, 2020
INVENTOR(S) : Takehiro Yoshida et al.

Page 1 of 1

It is certified that error appears in the above-identified patent and that said Letters Patent is hereby corrected as shown below:

In the Specification

Column 3, Line 67, "10" should read --1°--

Column 30, Line 52, "0.10" should read --0.1°--

Column 30, Line 55, "0.10" should read --0.1°--

Signed and Sealed this
Twenty-sixth Day of May, 2020

Andrei Iancu
*Director of the United States Patent and Trademark Office*